(12) United States Patent
Kokura

(10) Patent No.: US 8,217,442 B2
(45) Date of Patent: Jul. 10, 2012

(54) SEMICONDUCTOR DEVICE AND METHOD OF MANUFACTURING THE SAME

(75) Inventor: Hikaru Kokura, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/254,230

(22) Filed: Oct. 20, 2008

(65) Prior Publication Data
US 2009/0108326 A1    Apr. 30, 2009

(30) Foreign Application Priority Data

Oct. 29, 2007   (JP) .................................. 2007-280101

(51) Int. Cl.
*H01L 29/788*   (2006.01)
(52) U.S. Cl. ................. 257/316; 257/E21.179
(58) Field of Classification Search ............. 257/315, 257/316, 202, E21.179, E29.3, E21.682, 257/E21.683, E27.103, E27.108, E21.689, 257/E21.691

See application file for complete search history.

(56) References Cited

U.S. PATENT DOCUMENTS

| | | | |
|---|---|---|---|
| 5,950,086 A * | 9/1999 | Takahashi et al. | 438/258 |
| 2005/0064666 A1 * | 3/2005 | Kim | 438/286 |
| 2006/0231885 A1 * | 10/2006 | Lee | 257/314 |
| 2007/0047304 A1 * | 3/2007 | Lee et al. | 365/185.05 |
| 2009/0001425 A1 * | 1/2009 | Ariyoshi et al. | 257/202 |

FOREIGN PATENT DOCUMENTS

JP        10-163456 A      6/1998

* cited by examiner

*Primary Examiner* — Evan Pert
*Assistant Examiner* — Selim Ahmed
(74) *Attorney, Agent, or Firm* — Westerman, Hattori, Daniels & Adrian, LLP

(57) ABSTRACT

A semiconductor device has a semiconductor substrate, a plurality of first conductive patterns, a second conductive pattern having a top surface of which stepwisely or gradually decreases in height in a direction from a side facing the first conductive pattern toward an opposite side, a first insulation film formed over the plurality of first conductive patterns and the second conductive pattern, and a third conductive pattern formed over the first insulation film.

15 Claims, 19 Drawing Sheets

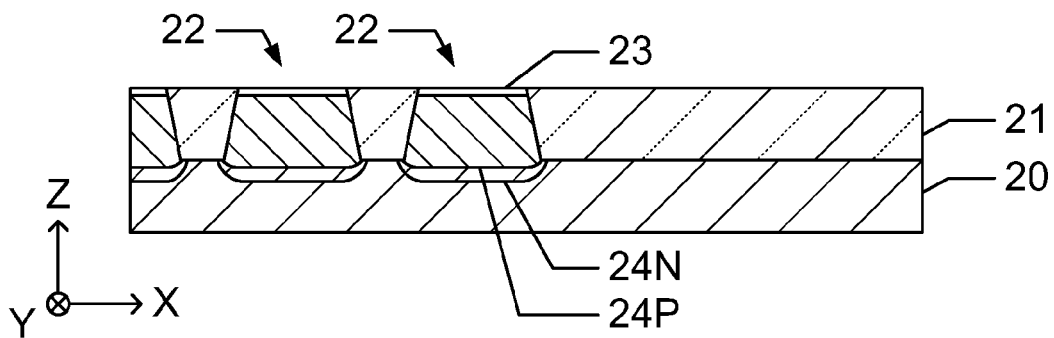
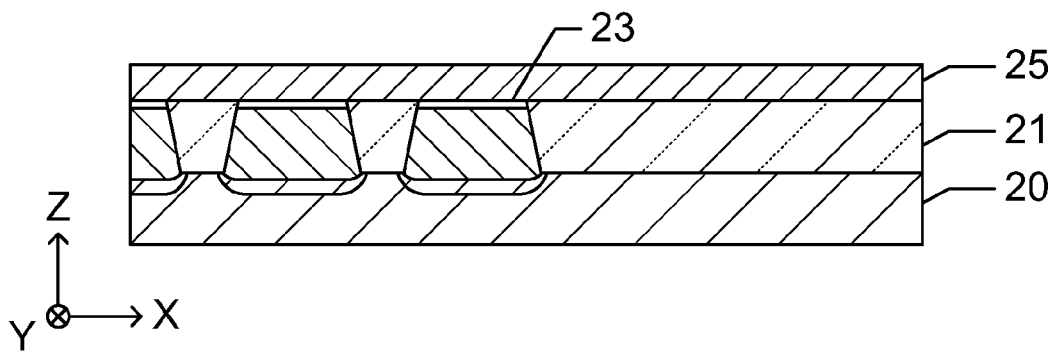
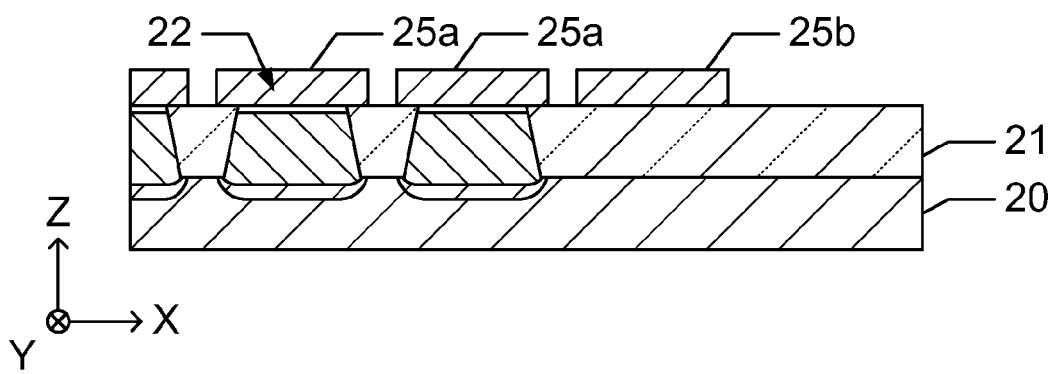
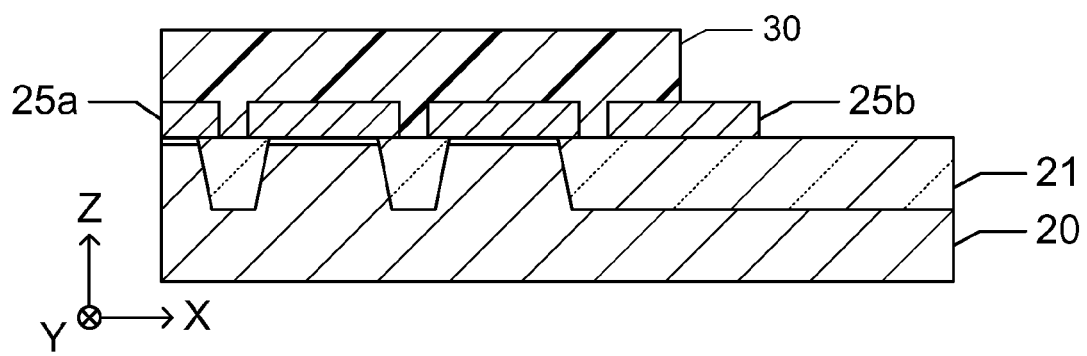

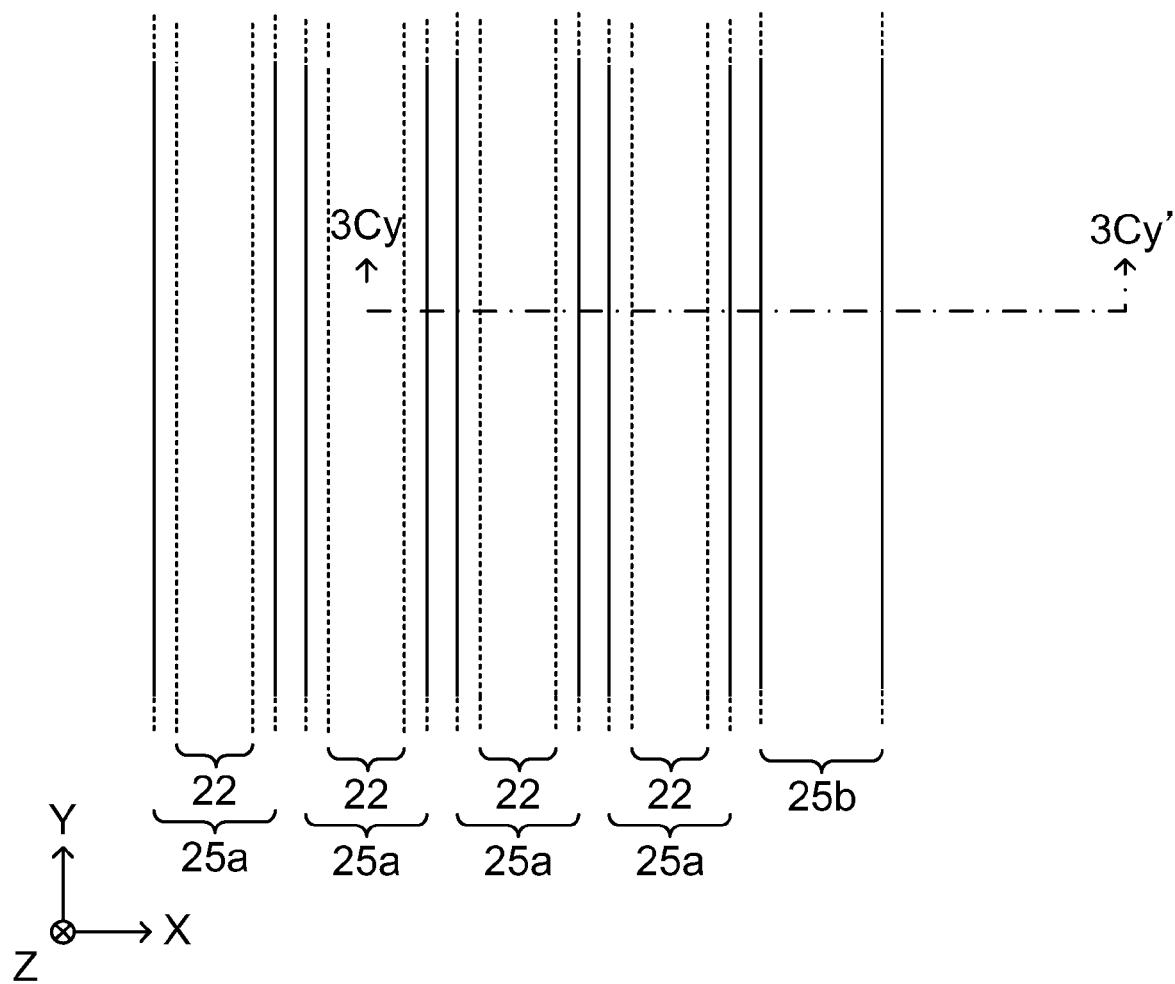

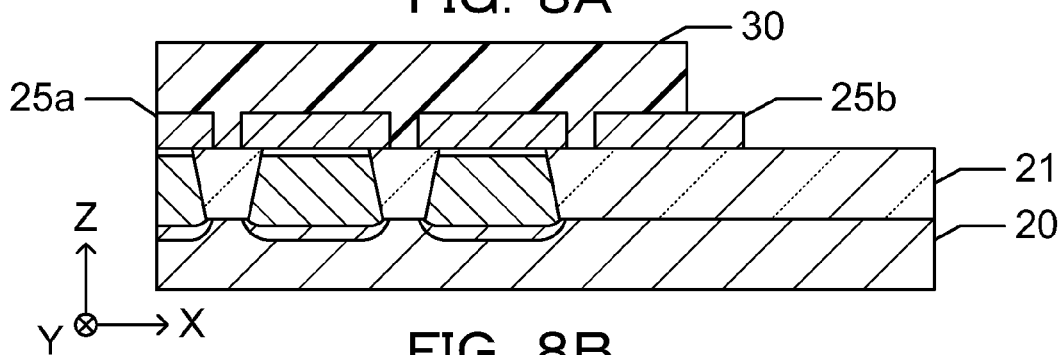
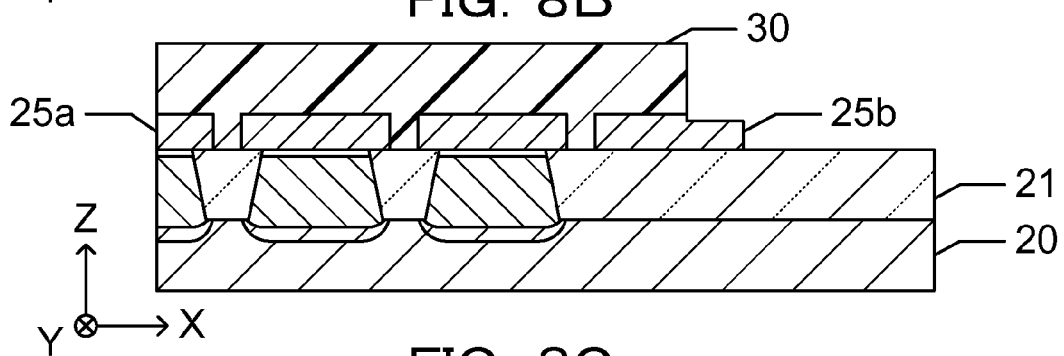
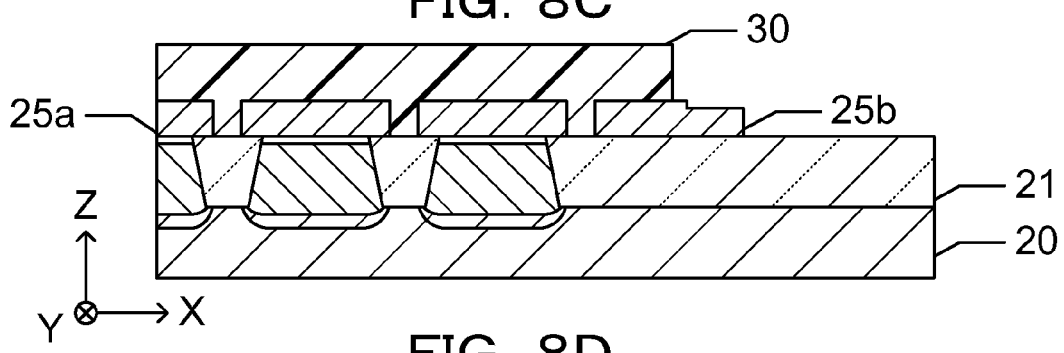
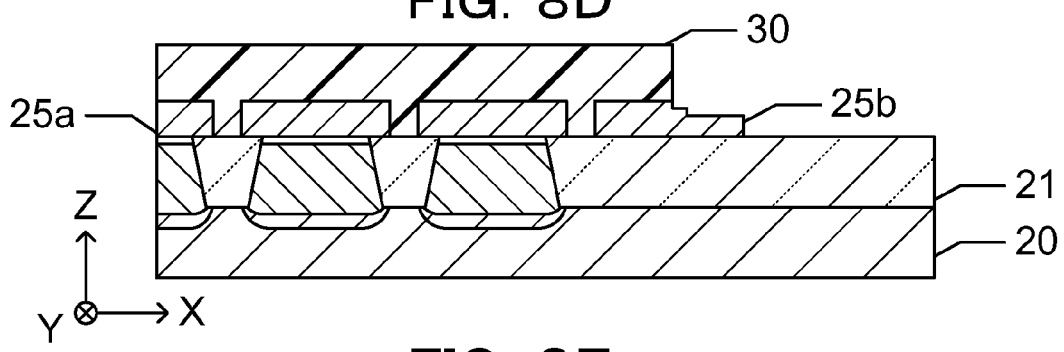
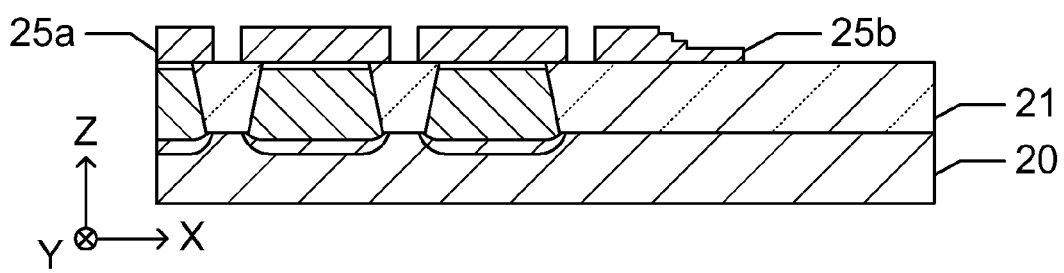

SEMICONDUCTOR DEVICE AND METHOD OF MANUFACTURING THE SAME

CROSS REFERENCE TO RELATED APPLICATIONS

This application is based upon and claims the benefit of prior from Japanese application No. 2007-280101 filed on Oct. 29, 2007 the entirety of which is incorporated herein by reference.

BACKGROUND

The present invention relates to a semiconductor device and a method of manufacturing the semiconductor device.

Each cell of a flash memory includes a gate structure in which a gate insulation film, a floating gate, an intermediate insulation film, and a control gate are laminated in this order. Hereinafter, a conventional method of manufacturing the flash memory will be discussed with reference to FIGS. 1A through 1D.

As shown in FIG. 1A, an element isolation film 21 is formed over a surface part of a substrate 20 including silicon and a plurality of activation regions provided in a lateral direction in FIG. 1A are determined. A first gate insulation film 23 is formed over a surface of the activation region. A floating gate 25a is formed over the first gate insulation film 23. In FIGS. 1A to 1D, current is caused to flow in a direction perpendicular to a plane of a sheet on which FIGS. 1A to 1D are illustrated. A source and a drain are provided on a near side and on a far side of the plane of the sheet, respectively. An intermediate insulation film 33 is formed over a surface of the floating gate 25a.

A conductive pattern 35a including polycrystalline silicon extending in a lateral direction in FIGS. 1A to 1D is formed such that the conductive pattern 35a passes above the floating gate 25a and intersects with the activation region. The conductive pattern 35a fills between the mutually adjacent floating gates 25a and a top surface of the conductive pattern 35a is substantially flat. While, a step is formed at a part corresponding to an outer end of the outermost floating gate 25a over the top surface of the conductive pattern 35a.

As shown in FIG. 1B, an insulation film 38 including silicon nitride is formed all over a surface of the substrate 20. As shown in FIG. 1C, anisotropic etching is carried out over the insulation film 38, thereby remaining a sidewall spacer 38a over a side surface of the conductive pattern 35a. At this stage, a unexpected residue 38b of the insulation film 38 may remain at the step over the top surface of the conductive pattern 35a.

After forming the sidewall spacer 38a, a dopant is implanted into the source, the drain, and the conductive pattern 35a.

As shown in FIG. 1D, a metal silicide film 43 is formed over the exposed surface of the conductive pattern 35a. The metal silicide film 43 is not formed over the area where the residue 38b still remains. A laminated structure including the conductive pattern 35a and the metal silicide film 43 forms a word line WL. The word line WL also serves as a control gate of each Field Effect Transistor (FET). An interlayer insulation film 50 is formed all over a surface of the substrate 20. A conductive plug 51 coupled to an end of the word line WL is formed through the interlayer insulation film 50.

The metal silicide film 43 is not formed over the area where the residue 38b still remains. In addition, the residue 38b blocks the dopant from being implanted into the conductive pattern 35a. This causes an increase in resistance of the word line WL. The increase in resistance of the word line WL leads to delay in writing data to a cell.

SUMMARY

According to one aspect of an embodiment, a semiconductor device has a semiconductor substrate, a plurality of first conductive patterns, a second conductive pattern having a top surface of which stepwisely or gradually decreases in height in a direction from a side facing the first conductive pattern toward an opposite side, a first insulation film formed over the plurality of first conductive patterns and the second conductive pattern, and a third conductive pattern formed over the first insulation film.

BRIEF DESCRIPTION OF THE DRAWINGS

FIGS. 5A to 5C are plan views respectively illustrating intermediate stages in manufacturing the flash memory according to the first embodiment, respectively;

FIGS. 8A to 8E are sectional views illustrating a method of manufacturing a flash memory according to a third embodiment;

PREFERRED EMBODIMENT

Figure 2:
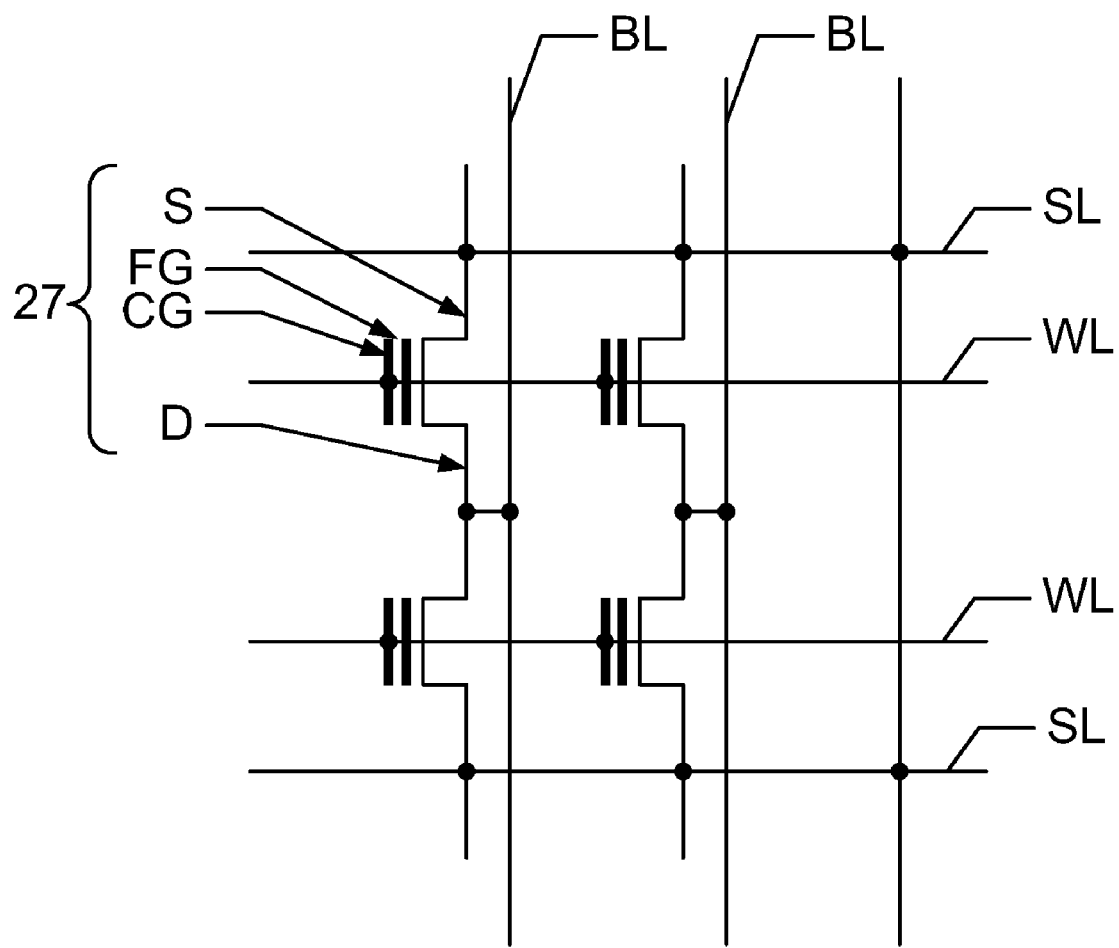
FIG. 2 illustrates an equivalent circuit diagram of the flash memory according to a first embodiment.

FIG. 2 illustrates an equivalent circuit diagram of a flash memory according to a first embodiment. A plurality of word lines WL extend in a lateral direction in FIG. 2 and a plurality of bit lines BL extend in a longitudinal direction in FIG. 2. An FET 27 having a floating gate is provided at an intersecting point of the word line WL and the bit line BL. The FET 27 includes a drain D, a source S, a floating gate FG, and a control gate CG. The drain D is coupled to the corresponding bit line BL and the control gate CG is coupled to the corresponding word line WL. The source S of each FET 27 is coupled to a source line SL.

In writing data to the flash memory, for example, the source line SL is configured to supply 0 volts (V), the bit line BL coupled to a cell which the data is written to is configured to supply 5V, and the word line WL coupled to a cell which the data is written to is configured to supply 10V. With the above-disclosed settings, channel hot electrons are injected into the floating gate FG. In reading data from the flash memory, for example, the source line SL is configured to supply 0V and the word line WL coupled to a cell which the data is read from is configured to supply 5V, so that an electrical signal generated on the bit line BL coupled to the cell which the data is read from may be detected. In erasing data at one time, for example, the source line SL is configured to supply 5V, the word line WL is configured to supply −10V, and the bit line BL is configured to assume a floating state. The above settings allow the electrons accumulated in the floating gate FG to be drawn to the source owing to a Fowler-Nordheim (FN) tunnel phenomenon.

Figure 3:
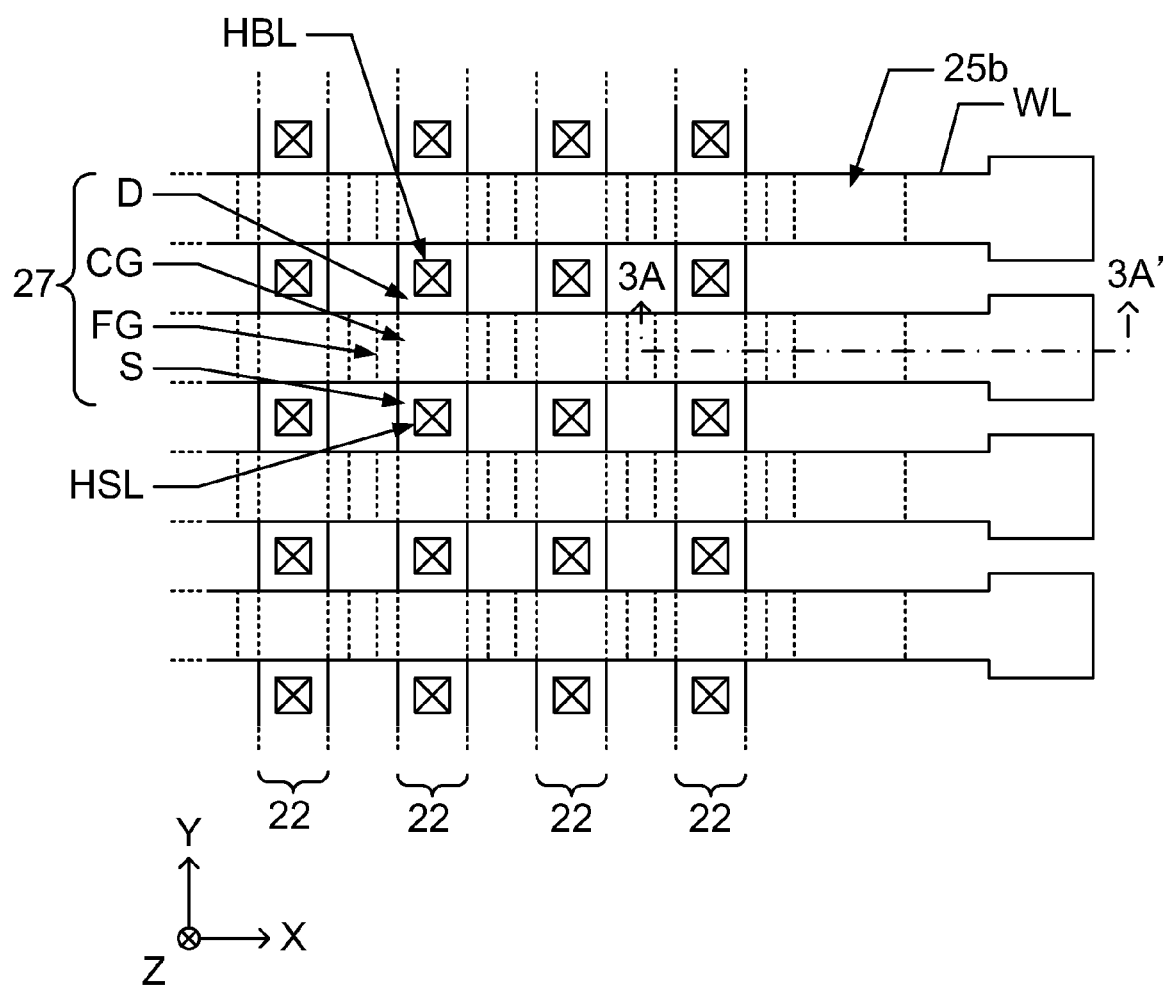
FIG. 3 illustrates a plan view of the flash memory according to the first embodiment.

FIG. 3 is a partial plan view illustrating the flash memory according to a first embodiment. A surface of a substrate 20 is defined as an XY surface and a Z-axis is set along a normal line direction, whereby an XYZ orthogonal coordinate system is defined. A plurality of activation regions 22 extending in a Y-axis direction are provided across an X-axis direction. A plurality of word lines WL extending in the X-axis direction are provided across the Y-axis direction.
The floating gate type FET 27 is provided at an intersecting point of the word line WL and the activation region 22.

The FET 27 includes a floating gate FG, a control gate CG, a source S, and a drain D. The control gates CG of the FETs 27 adjacent in the X-axis direction are successively provided with each other so that the word line WL is formed. The floating gate FG is provided below the word line WL and is separated from the other floating gates FG included in the adjacent FETs 27.

Figure 1A:
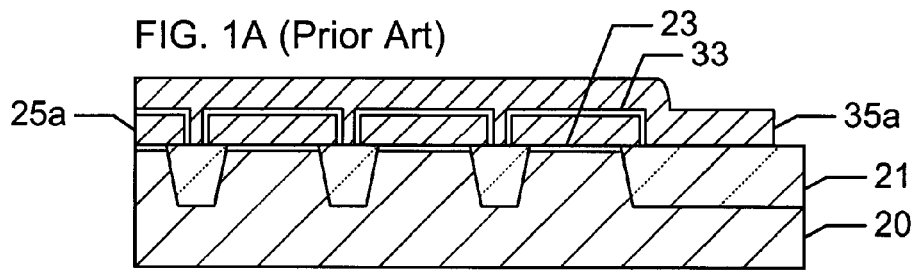
FIGS. 1A to 1D are sectional views illustrating a conventional method of manufacturing a flash memory.
Figure 1B:
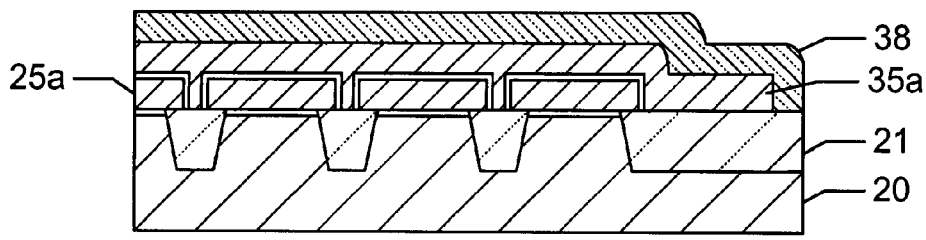
Figure 1C:
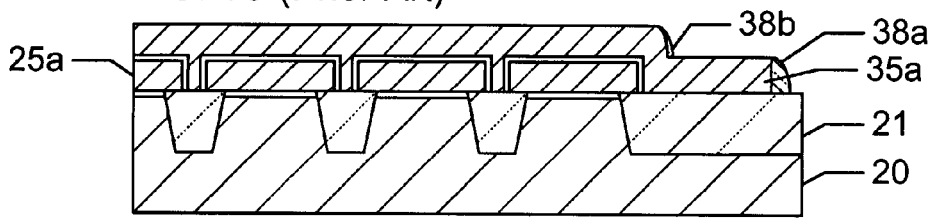
Figure 1D:
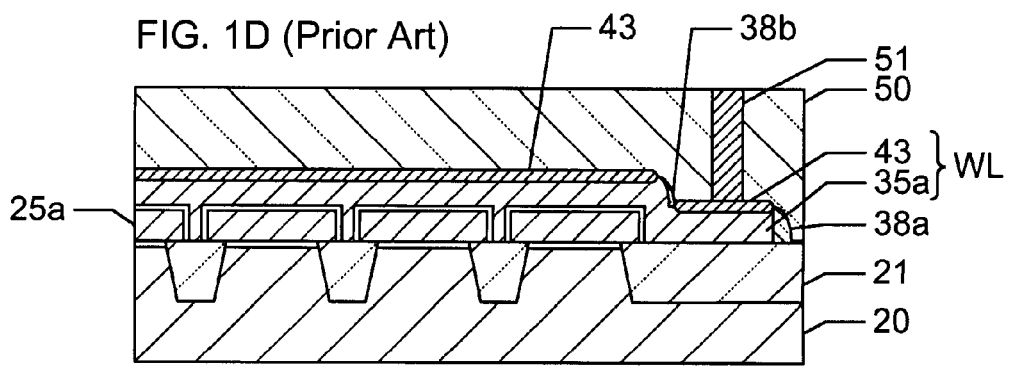

Among the activation regions 22, a region on one side of the word line WL is the source S and a region on the other side thereof is the drain D. The drain D is coupled to an upper layer bit line BL through a via-hole HBL and the source S is coupled to an upper layer source line SL through a via-hole HSL. As shown in FIG. 1D, the bit line BL extends in a direction perpendicular to the word line WL, that is to say, in the Y-axis direction. The source line SL extends in a direction parallel to the word line WL, that is to say, in the X-axis direction.

In FIG. 3, a step reduction pattern 25b is provided on a right side of the rightmost activation region 22 and below the word line WL. For example, a planer shape of the step reduction pattern 25b is the same as planer shapes of the floating gates FG of the respective FETs 27. The planer shape of the step reduction pattern 25b may be different from the planer shape of the floating gate FG of the FET 27. Moreover, an interval between the step reduction pattern 25b and the floating gate FG in the FET 27 that is nearest the step reduction pattern 25b may be equal to or different from an interval between the floating gates FG of the two FETs 27 that are mutually adjacent in the X-axis direction.

Figure 4E:
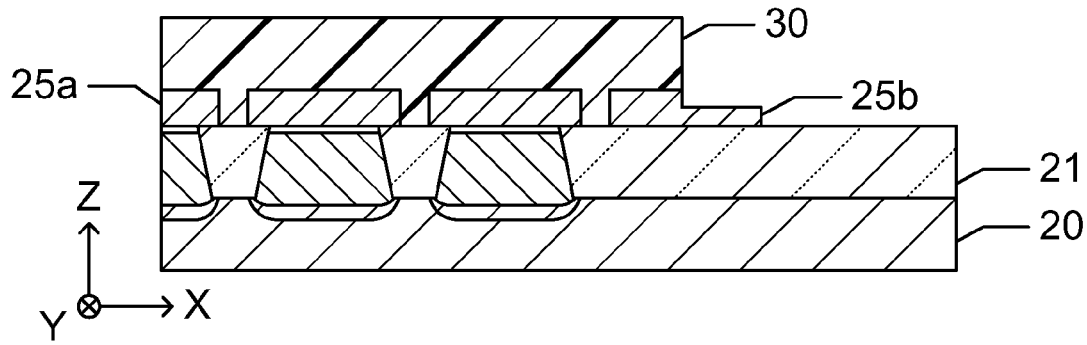
FIGS. 4A to 4X are sectional views illustrating a method of manufacturing the flash memory according to the first embodiment.
Figure 4F:
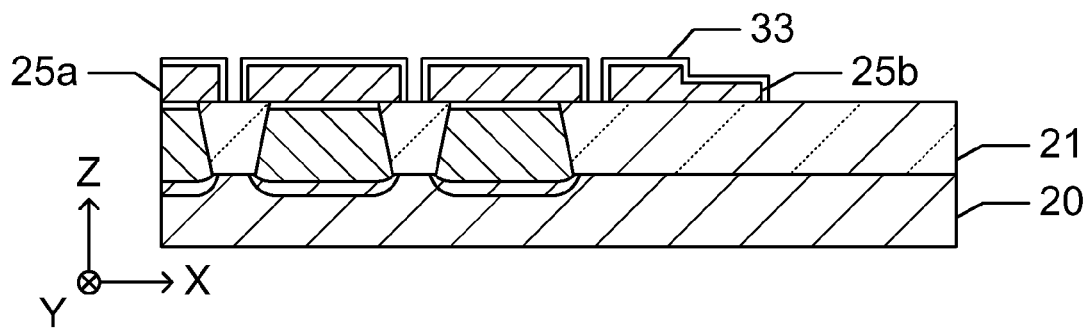
Figure 4G:
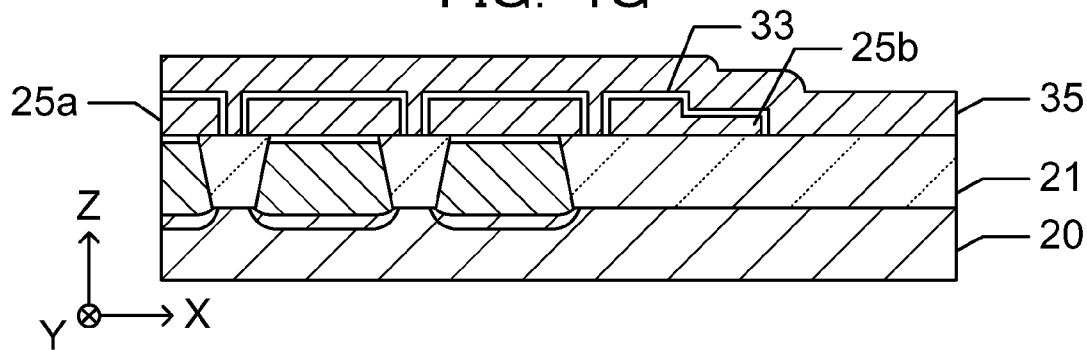
Figure 4H:
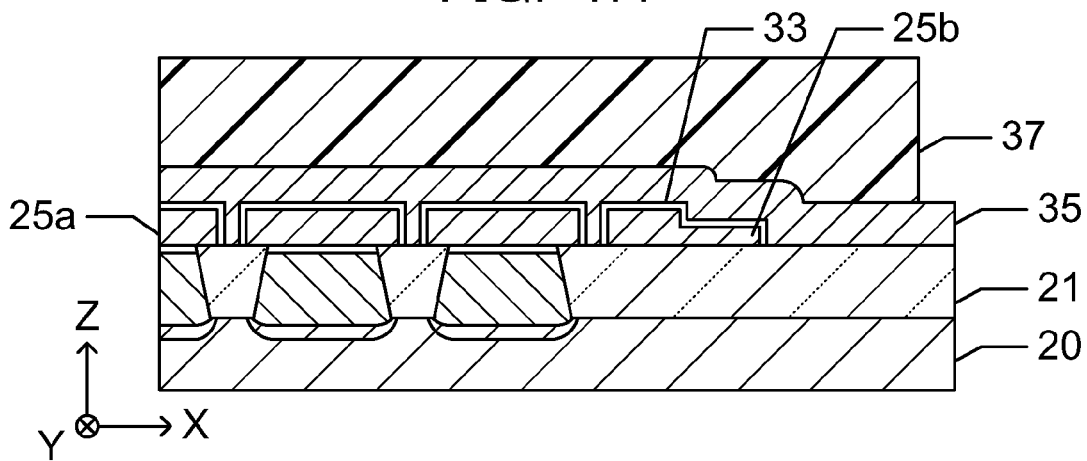
Figure 4I:
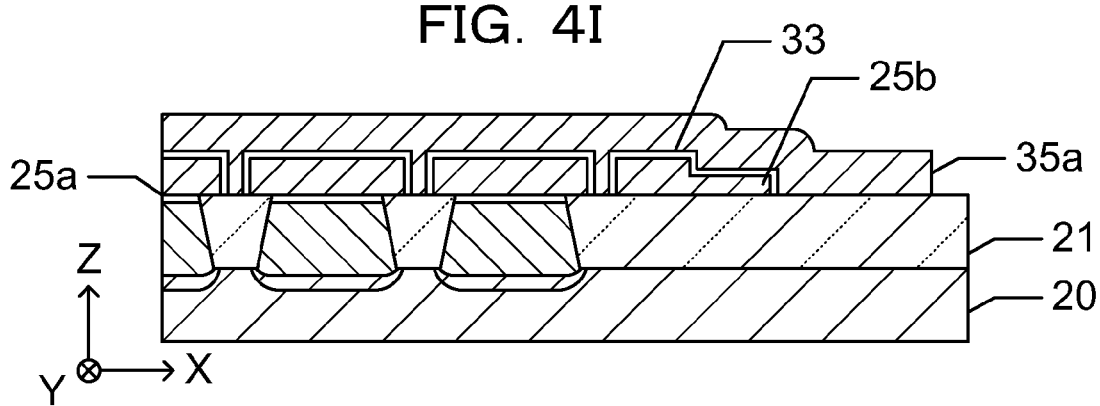
Figure 4J:
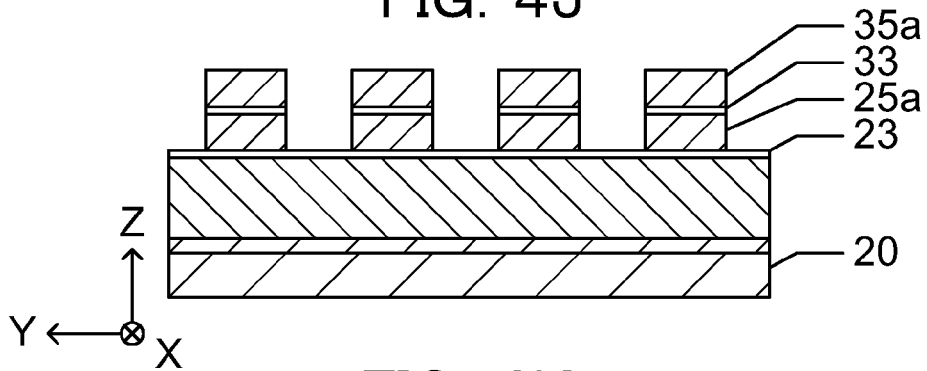
Figure 4K:
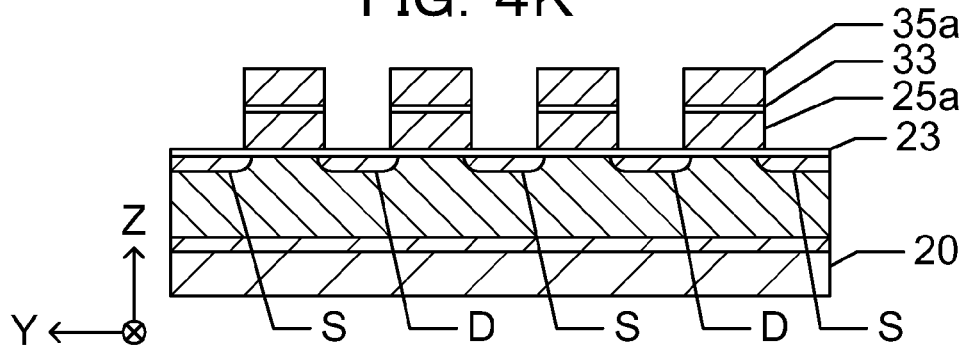
Figure 4L:
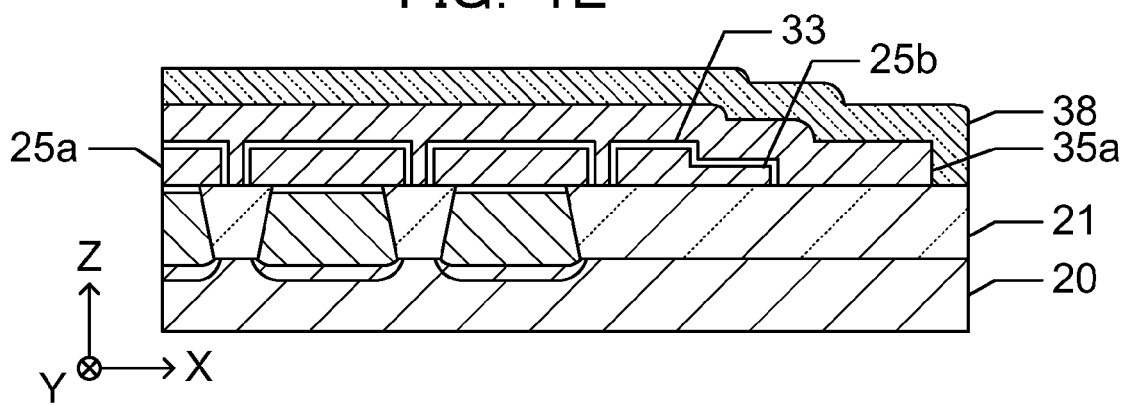
Figure 4M:
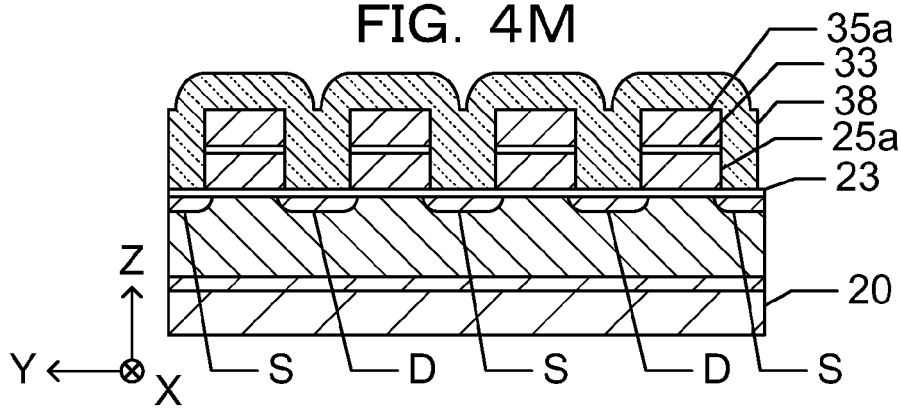
Figure 4N:
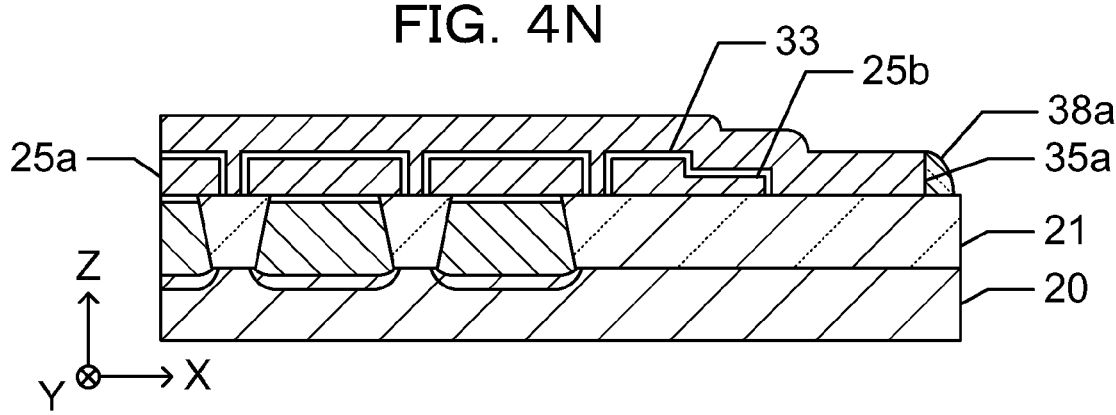
Figure 4O:
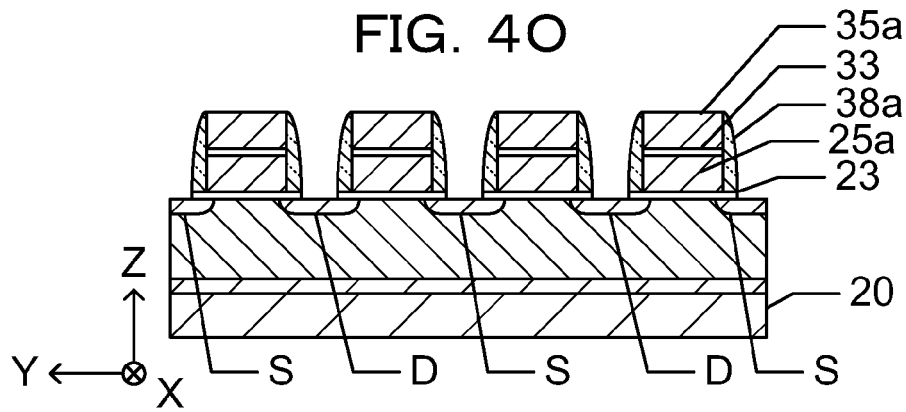
Figure 4P:
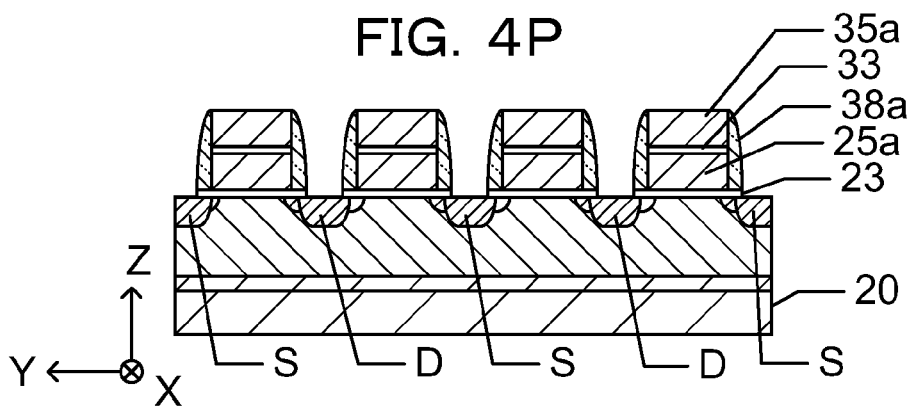
Figure 4Q:
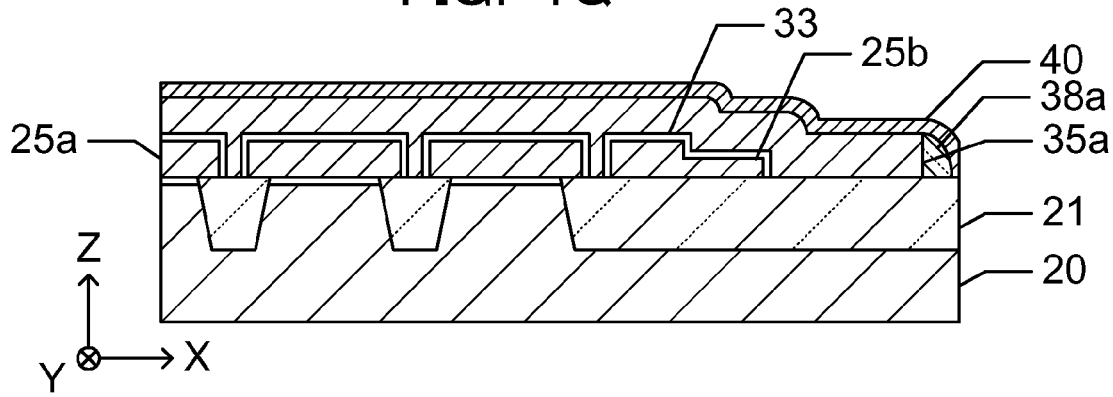
Figure 4R:
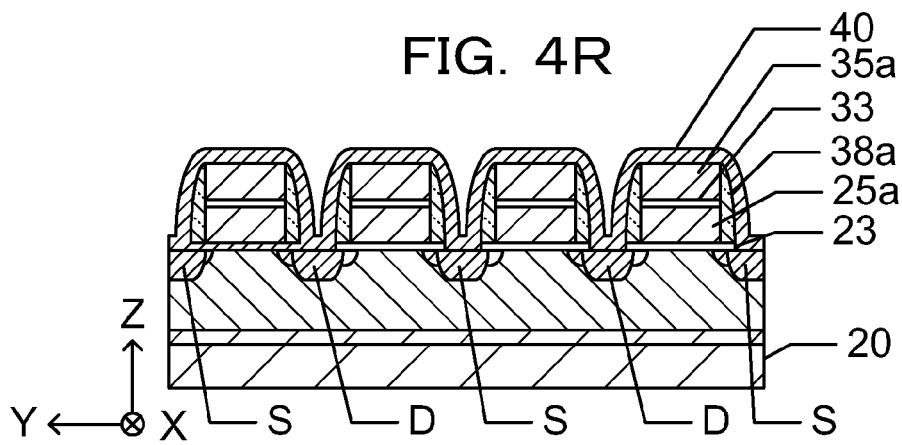
Figure 4S:
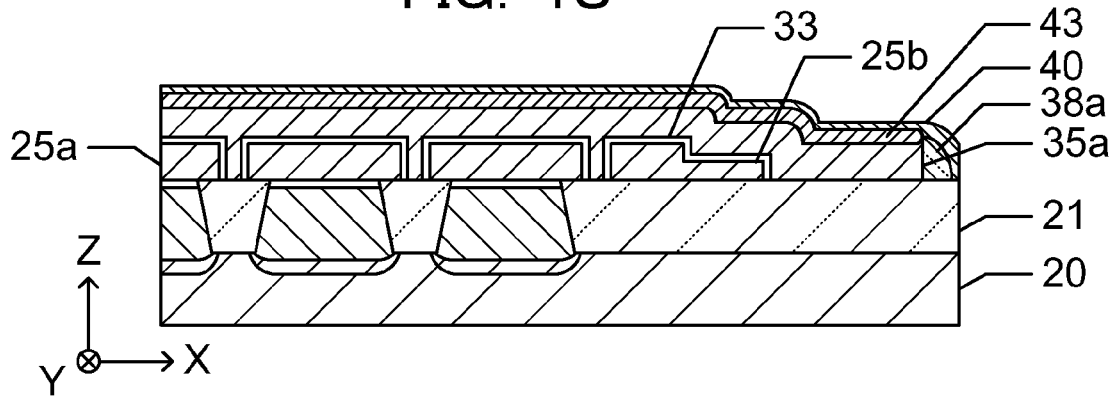
Figure 4T:
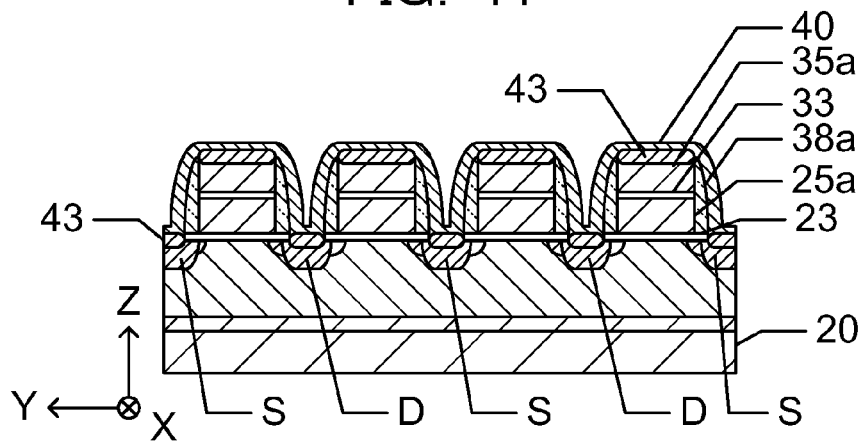
Figure 4U:
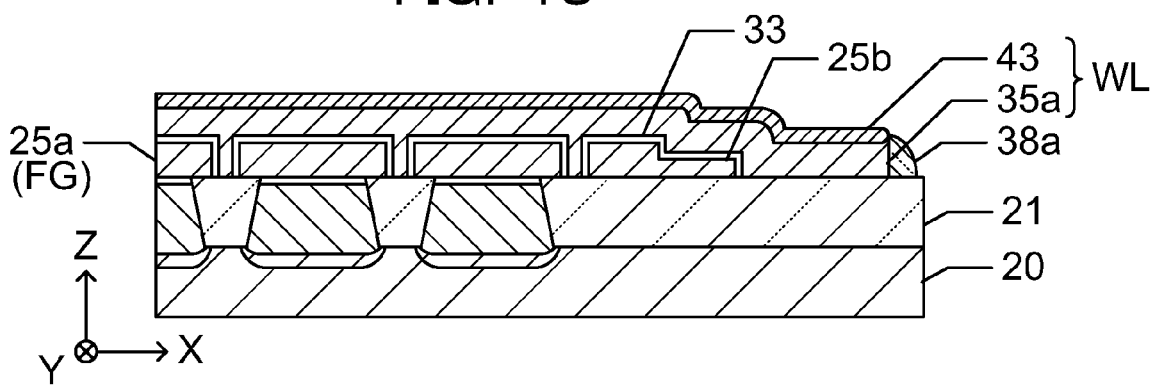
Figure 4V:
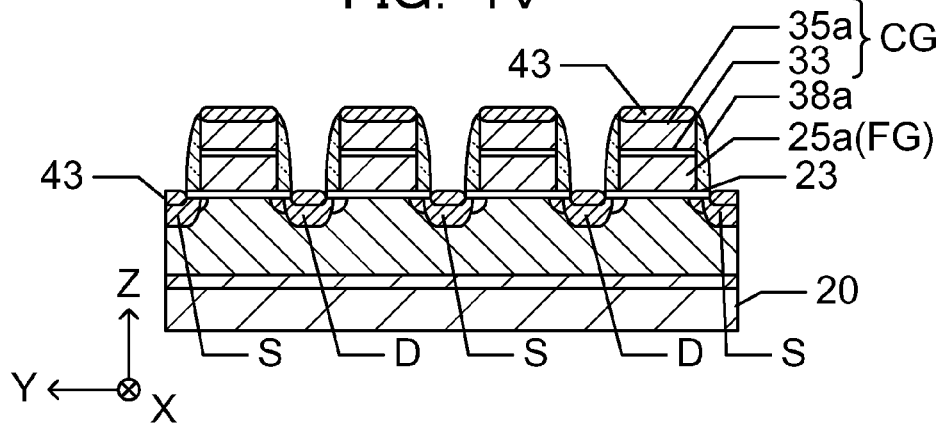
Figure 4W:
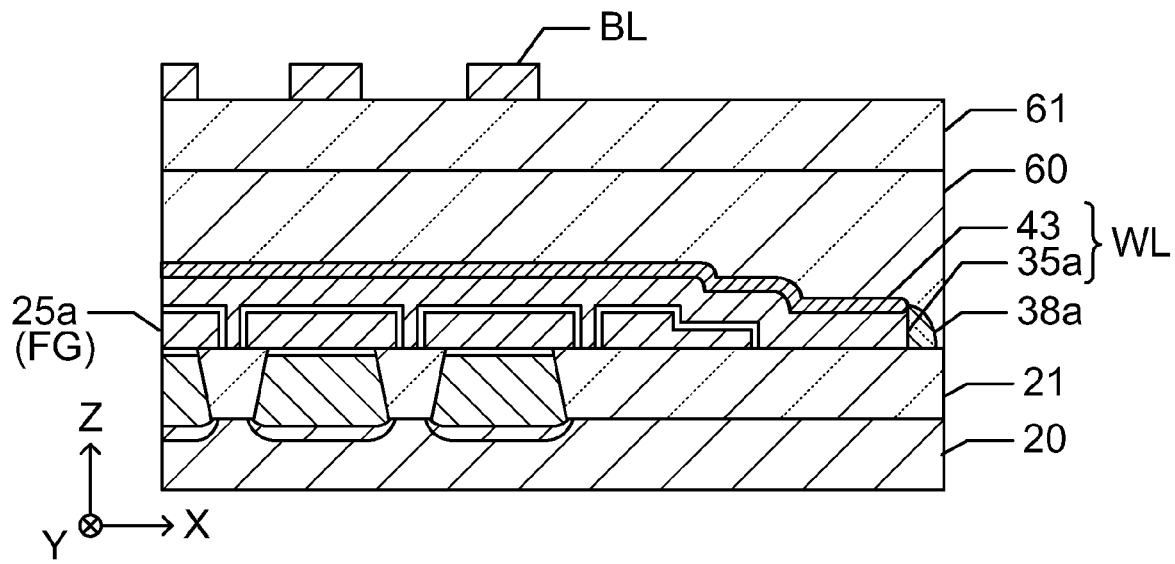
Figure 4X:
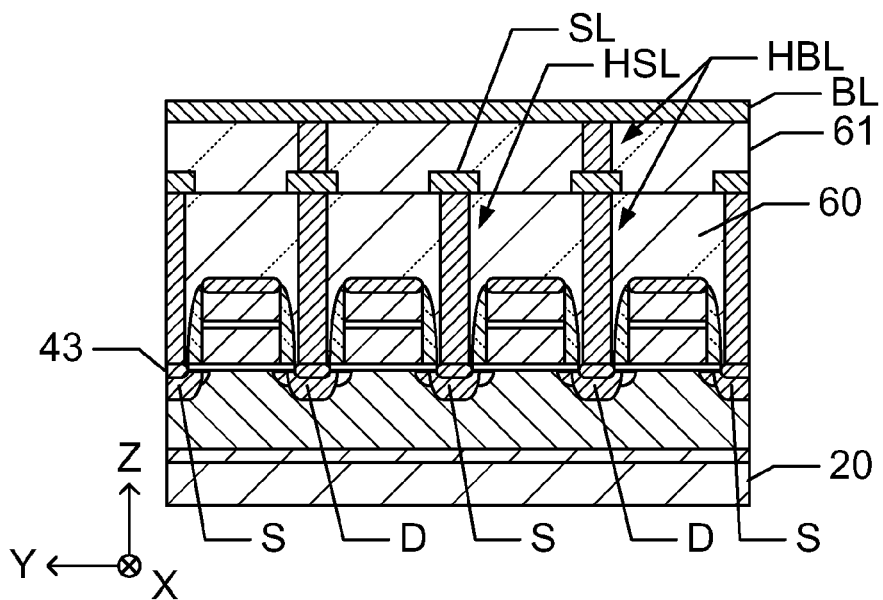

A method of manufacturing the flash memory according to the first embodiment will be disclosed with reference to FIGS. 4A to 4X. FIG. 4A is a sectional view taken on a dashed-dotted line 3A-3A' in FIG. 3.

As shown in FIG. 4A, an element isolation insulation film 21 having a Shallow Trench Isolation (STI) structure is formed over a surface part of the semiconductor substrate 20, including such as silicon, so that a plurality of activation regions 22 extending in the Y-axis direction is determined. A dopant is implanted into the activation region 22, whereby an N-type well 24N is formed, and thereafter a P-type well 24P shallower than the N-type well 24N is formed. After forming the wells, a first gate insulation film 23 is formed over a surface of the activation region 22. For example, the first gate insulation film includes a silicon oxide film. For example, an oxidized gas such as $N_2O$ is used to form the first gate insulation film 23 by thermally oxidizing a surface of the substrate 20 at 1000 degrees centigrade (° C.).

For example, the first gate insulation film 23 may have the thickness of 10 nanometers (nm). This thickness is preferable when electrons are drawn from the floating gate FG with the FN tunnel phenomenon.

As shown in FIG. 4B, a first conductive film 25, such as doped amorphous silicon, is formed over the semiconductor substrate 20. For example, Chemical Vapor Deposition (CVD) with $SiH_4$ and $PH_3$ as a material gas may be used to form the first conductive film 25 with a substrate temperature of 530° C. A thickness of the first conductive film 25 is, for example, 110 nm.

As shown in FIG. 4C and FIG. 5A, the first conductive film 25 is patterned, so that a first conductive pattern 25a and the step reduction pattern 25b are formed. FIG. 5A is a plan view and FIG. 4C is a sectional view taken on a dashed-dotted line 3Cy-3Cy' in FIG. 5A. For example, an inductively coupled plasma etching apparatus performs the patterning of the first conductive film 25. As an etching gas, a gaseous mixture such as HBr and $Cl_2$ is used to carry out the patterning at a pressure of 10 mTorr.

The first conductive pattern 25a is provided responsive to the activation region 22 and the first conductive pattern 25a in the X-axis direction is wider in width than the activation region 22. In other words, the first conductive pattern 25a extends in the Y-axis direction and the plurality of first conductive patterns 25a are provided across the X-axis direction. The step reduction pattern 25b is provided on an outside of the outermost first conductive pattern 25a. An interval between the step reduction pattern 25b and the outermost first conductive pattern 25a may be equal to or different from an interval between the mutually adjacent first conductive patterns 25a. Furthermore, a planer shape of the step reduction pattern 25b may be the same as a planer shape of the first conductive pattern 25a. However, the planer shape of the step reduction pattern 25b is not necessarily the same as the planer shape of the first conductive pattern 25a. For example, the step reduction pattern 25b may have a wider planer shape than that of the first conductive pattern 25a. In addition, the activation region may be formed below the step reduction pattern 25b.

As shown in FIG. 4D, a resist pattern 30 which covers the first conductive pattern 25a and an area between the first conductive patterns 25a is formed. The resist pattern 30 is formed over a top surface of the outermost first conductive pattern 25a to over a part of a top surface of the step reduction pattern 25b. Over the top surface of the step reduction pattern 25b, the resist pattern 30 covers the part on a near side of the first conductive pattern 25a.

As shown in FIG. 4E, the step reduction pattern 25b is made thinner to a certain extent in a thickness direction by etching with use of the resist pattern 30 as a mask. The etching of the step reduction pattern 25b may be performed under the same conditions as the patterning of the first conductive film 25. The resist pattern 30 is removed after the etching. A part of the step reduction pattern 25b on a far side of the first conductive pattern 25a, is made thinner, whereby a step which stepwisely decreases in height in a direction from one end of a first conductive pattern 25a side toward the other end is formed over the top surface of the step reduction pattern 25b. In the step reduction pattern 25b, one side facing the first conductive pattern 25a is defined as an "inside" and on the other side, an opposite side thereof is defined as an "outside", in the present embodiment.

As shown in FIG. 4F, an intermediate insulation film 33 is formed over the surfaces of first conductive pattern 25a and of the step reduction pattern 25b. The intermediate insulation film 33 has a three-laminated structure in which, for example, a silicon oxide film, a silicon nitride film, and a silicon oxide film are laminated in this order. Hereinafter, one example of a method of forming the intermediate insulation film 33 will be disclosed.

First, the silicon oxide film is formed over the first conductive pattern 25a and the step reduction pattern 25b by the CVD. A material gas such as $SiH_2Cl_2$ and $O_2$ is used to deposit the silicon oxide film with a substrate temperature of 700° C. The silicon nitride film is deposited over a surface of the silicon oxide film by the CVD. A material gas such as $SiH_2Cl_2$ and $NH_3$ is used to deposit the silicon nitride film with the substrate temperature of 700° C. A surface part of the deposited silicon nitride undergoes thermal oxidation, whereby a silicon oxide film is formed. In consequence, the intermediate insulation film 33 is formed.

As shown in FIG. 4G, a second conductive film 35, including such as polycrystalline silicon, is formed all over the surface of the substrate 20 such that the second conductive film 35 covers the first conductive pattern 25a and the step reduction pattern 25b with the intermediate insulation film formed thereon. A material gas such as $SiH_4$ is used to deposit the second conductive film 35 by the CVD with the substrate temperature of 620° C.

It is preferable that the second conductive film 35 has a thickness equal to or more than half of the interval of the first conductive patterns 25a adjacent with each other. In the above case, the area between the mutually adjacent first conductive patterns 25a and the area between the first conductive pattern 25a and the step reduction pattern 25b are filled with the second conductive film 35, so that a top surface of the second conductive film 35 over these areas becomes substantially flat. Although the interval between the step reduction pattern 25b and the outermost first conductive pattern 25a is made equal to the interval between the mutually adjacent first conductive patterns 25a, both intervals are not necessarily made equal.

In response to a step formed over the top surface of the step reduction pattern 25b and a step corresponding to an outer end of the step reduction pattern 25b, a step is formed over a top surface of the second conductive film 35.

Figure 5B:
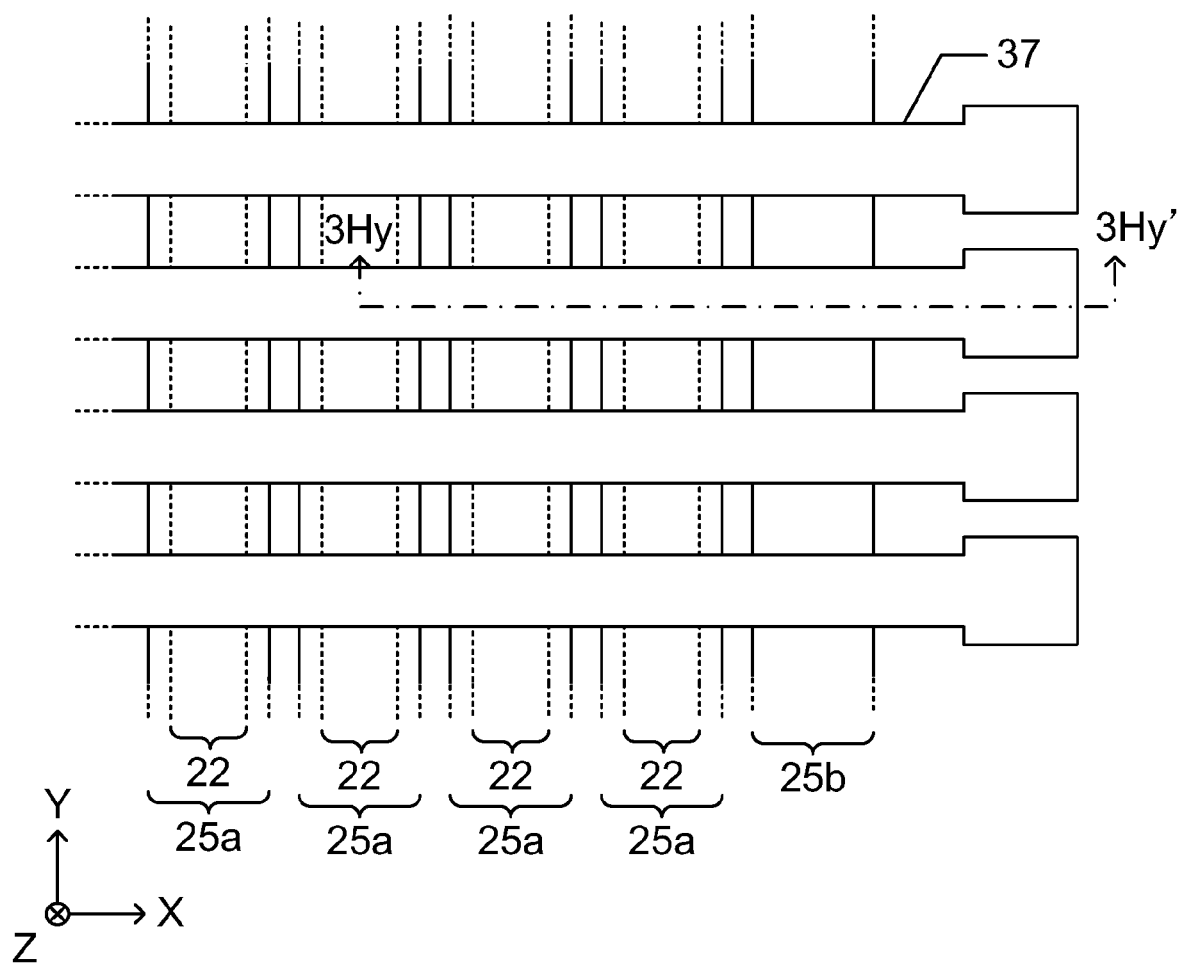

As shown in FIG. 4H and FIG. 5B, a part of the top surface of the second conductive pattern 35 is covered with a resist pattern 37. FIG. 5B is a plan view and FIG. 4H is a sectional view taken on a dashed-dotted line 3Hy-3Hy' in FIG. 5B. The resist pattern 37 has the same planer shape as the word line WL shown in FIG. 3. Each of the resist patterns 37 extends in the X-axis direction and intersects with the first conductive pattern 25a and the step reduction pattern 25b.

The second conductive film 35, the intermediate insulation film 33, the first conductive pattern 25a, and the step reduction pattern 25b are etched with use of the resist pattern 37 as a mask. For example, an etching gas such as HBr and $Cl_2$ is used to etch the second conductive film 35, the first conductive pattern 25a, and the step reduction pattern 25b using an inductively coupled plasma etching apparatus. An etching gas such as CF4 is used to etch the intermediate insulation film 33. The resist pattern 37 is removed after the etching.

Figure 5C:
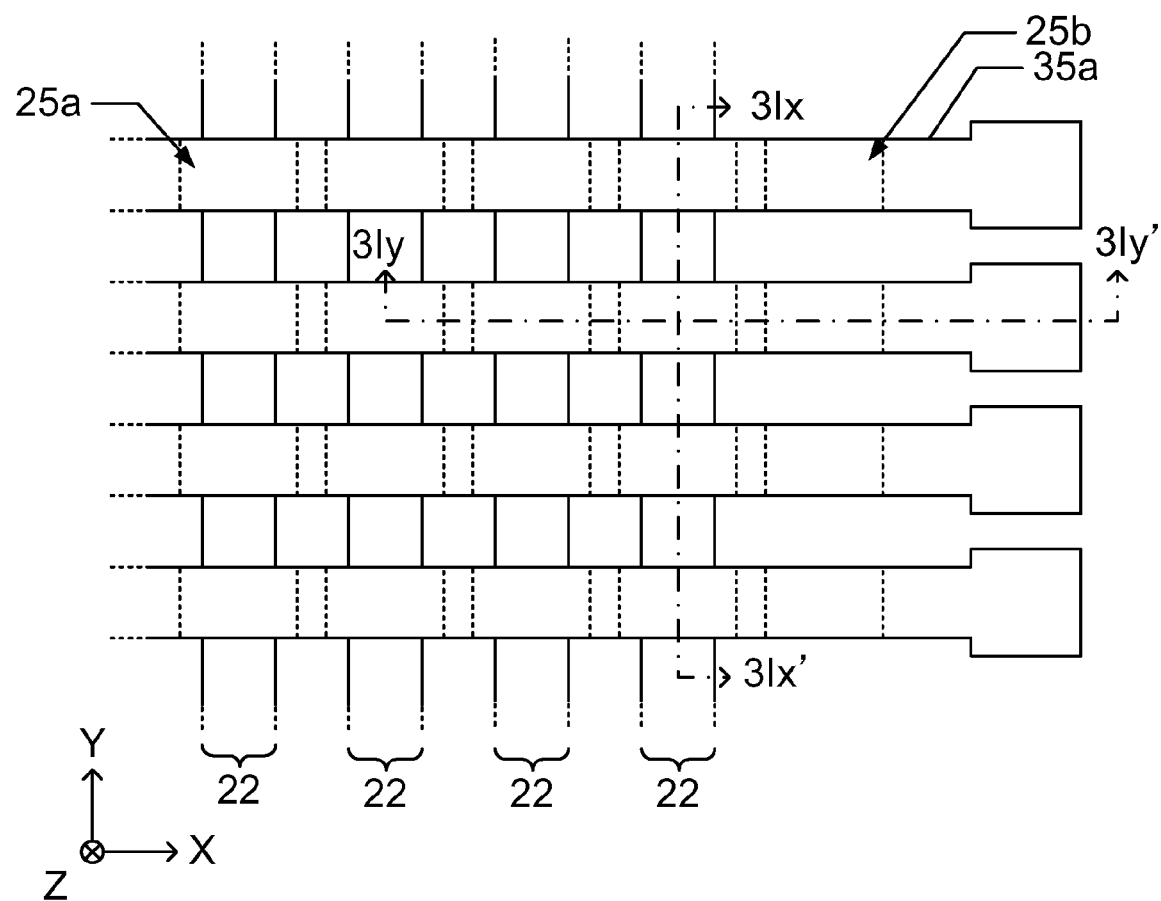

As shown in FIGS. 4I and 4J and FIG. 5C, the plurality of second conductive patterns 35a extending in the X-axis direction are formed. FIG. 5C is a plan view and FIGS. 4I and 4J are sectional views taken on dashed-dotted lines 3Iy-3Iy' and 3Ix-3Ix' of FIG. 5C, respectively.

The intermediate insulation film 33, the first conductive pattern 25a, and the step reduction pattern 25b remain under the second conductive pattern 35a.

As shown in FIG. 4K, an N-type dopant is ion-implanted into the activation region 22 on both sides of the second conductive pattern 35a, whereby an extension region for the source S and the drain D are formed. At this stage, the N-type dopant is introduced into the second conductive pattern 35a.

As shown in FIGS. 4L and 4M, an insulation film 38, including such as silicon nitride, is formed all over the surface of the substrate 20 such that the insulation film 38 covers the second conductive pattern 35a. A materials gas such as $SiH_2Cl_2$ and $NH_3$ is used to deposit the insulation film 38 by CVD with the substrate temperature at 700° C. A thickness of the insulation film is, for example, 100 nm.

The insulation film 38 is anisotropically etched. For example, the etching is performed by a capacitive coupled plasma etching apparatus with use of $CHF_3$, Ar, and $O_2$ as an etching gas. A pressure of 10 mTorr is preferable in etching the insulation film 38.

As shown in FIGS. 4N and 4O, a sidewall spacer 38a including the silicon nitride remains over a side surface of the second conductive pattern 35a, the first conductive pattern 25a, and the step reduction pattern 25b. Since the step is formed over the top surface of the step reduction pattern 25b, so that the part on the opposite side of the first conductive pattern 25a is made thinner, the step at the end of the step reduction pattern 25b decreases in height. Owing to this, the step formed over the top surface of the second conductive pattern 35a also decreases in height. Consequently, it is possible to prevent a residue of the insulation film 38 from being formed over the step of the second conductive pattern 35a.

As shown in FIG. 4P, the N-type dopant is ion-implanted into the activation region 22 with use of the second conductive pattern 35a, the sidewall spacer 38a or the like as a mask, whereby the source S and the drain D are formed. In this process, the N-type dopant is also introduced into the second conductive pattern 35a.

As shown in FIGS. 4Q and 4R, a Co film 40 is formed all over the surface of the substrate 20 by sputtering. Note that other metals capable of forming a compound with silicon such as Ti, Ni or the like may be used, instead of Co.

As shown in FIGS. 4S and 4T, a metal silicide film 43 is formed at an interface between the Co film 40 and the second conductive pattern 35a by, for example, performing a thermal heating process at 500° C. Then, the metal silicide film 43 is formed over surfaces of the source S and of the drain D.

As shown in FIGS. 4U and 4V, an unreacted Co film 40 is removed. The Co film is removed by wet etching with use of a liquid mixture of ammonia water and hydrogen peroxide water. A two-layer lamination of the second conductive pattern 35a and the metal silicide film 43 thereover shown in FIG. 4U serves as the word line WL. As shown in FIG. 4V, the first conductive pattern 25a serves as the floating gate FG and the second conductive pattern 35a and the metal silicide film 43 thereover serve as the control gate CG.

As shown in FIGS. 4W and 4X, a first inter-layer insulation film 60 is formed all over the surface of the substrate 20. The via-hole HSL that exposes the source S and the via-hole HBL that exposes the drain D are formed through the first inter-layer insulation film 60. These via-holes are filled with conductive plugs. The source line SL is formed over the first inter-layer insulation film 60. The source line SL is coupled to the source S via the conductive plug filling the via-hole HSL.

A second inter-layer insulation film 61 is formed over the source line SL and the first inter-layer insulation film 60. The via-hole HBL is formed through the second inter-layer insulation film 61 and the conductive plug fills the via-hole HBL. The bit line BL is formed over the second inter-layer insulation film 61. The bit line BL is coupled to the drain D via the conductive plug filling the via-hole HBL.

In the above-disclosed first embodiment, the step is formed on the top surface of the step reduction pattern 25b such that the step decreases in height in the direction from an end on a side of the FET 27 toward an end on an end side of the word line WL. Consequently, the residue due to the anisotropic etching shown in FIGS. 4N and 4O may be restrained from being formed. Moreover, the metal silicide film 43 may be formed over the top surface of the second conductive pattern 35a.

The sidewall spacer 38a restricts the electrons accumulated in the floating gate FG from flowing outside, so that a preferable holding characteristic may be ensured.

Figure 6:
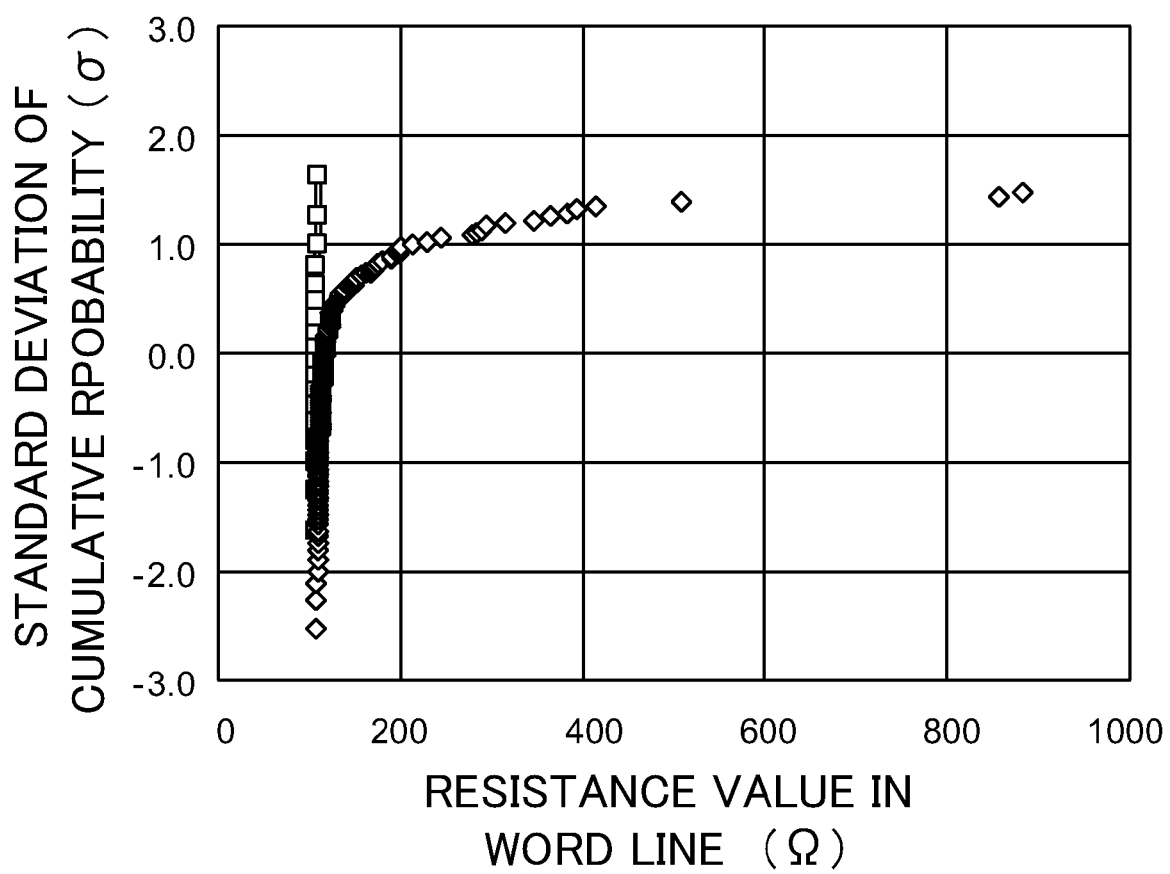
FIG. 6 is a graph illustrating standard deviations of cumulative probability of resistance values in word lines.

FIG. 6 is a graph illustrating standard deviations of cumulative probability of resistances in word lines. A lateral axis indicates the resistances of the word lines and a longitudinal axis indicates the standard deviations of the cumulative probability. White squares (□) in FIG. 6 indicate distribution of the resistances of the word lines formed by the method according to the first embodiment. On the other hand, white rhombuses (◇) indicate distribution of resistances of word line specimens without the step reduction pattern being formed. It is recognized that the method according to the first embodiment achieves a word line with low resistance.

Figure 7A:
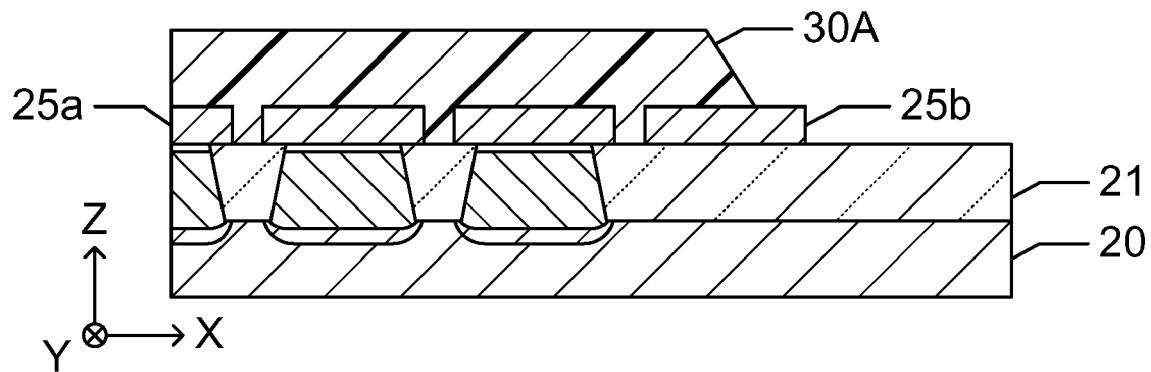
FIGS. 7A to 7C are sectional views illustrating a method of manufacturing a flash memory according to a second embodiment.
Figure 7B:
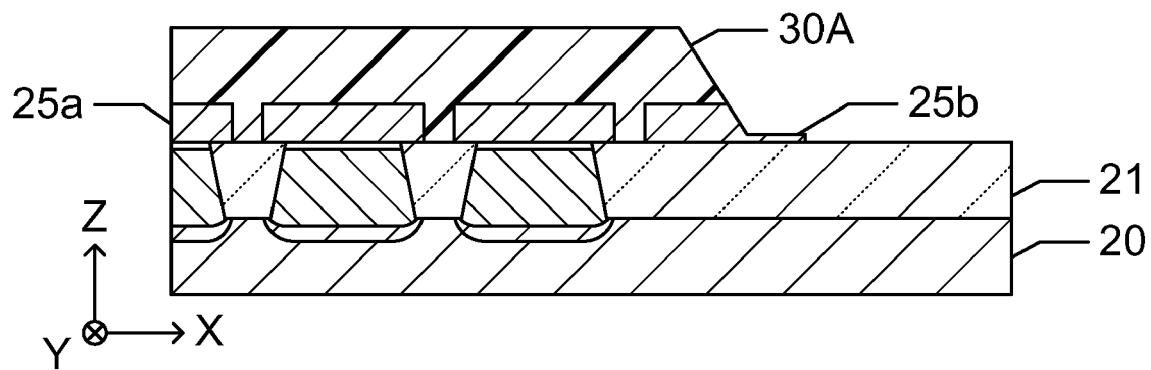
Figure 7C:
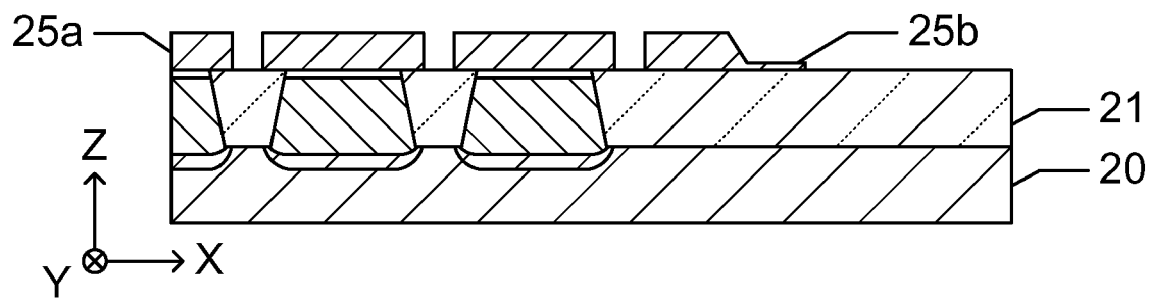

A method of manufacturing a flash memory according to a second embodiment will be disclosed with reference to FIGS. 7A to 7C.

FIG. 7A corresponds to a structure shown in FIG. 4D in the first embodiment. In the first embodiment, the side surface of the resist pattern 30 is substantially vertically formed. On the other hand, a side surface of a resist pattern 30A is inclined in the second embodiment. For example, resist pattern 30A as disclosed above may be formed by shifting a focus in carrying out exposure.

As shown in FIG. 7B, a step reduction pattern 25b is etched to a certain extent in a thickness direction with use of the resist pattern 30A as a mask. Since the resist pattern 30A is etched little by little, a top surface of the step reduction pattern 25b is formed in an inclined shape.

As shown in FIG. 7C, the resist pattern 30A is removed. Processes thereafter are the same as the processes following the process of forming the intermediate insulation film 33 shown in FIG. 4F in the first embodiment.

According to the second embodiment, a step surface formed over the top surface of the step reduction pattern 25b is inclined such that the step decreases in height in a direction from an end on an inside toward an end on an outside.

A method of manufacturing a flash memory according to a third embodiment will be disclosed with reference to FIGS. 8A to 8E.

A structure in FIG. 8A is the same as the structure shown in FIG. 4D in the first embodiment. As shown in FIG. 8B, a part of a step reduction pattern 25b is etched to a certain extent in a thickness direction with use of a resist pattern 30 as a mask.

As shown in FIG. 8C, a surface part of the resist pattern 30 is ashed with use of $O_2$. The ashing causes a side surface of the resist pattern 30 provided over the step reduction pattern 25b to shift. The preferable amount of shifting is such that the side surface falls within the range of a top surface of the step reduction pattern 25b.

As shown in FIG. 8D, the step reduction pattern 25b is further etched to a certain extent in the thickness direction with use of the resist pattern 30 with its side surface shifted, as a mask. A plurality of steps are formed over the top surface of the step reduction pattern 25b by repeating the recession of the side surface of the resist pattern 30 and the etching of the step reduction pattern 25b. As shown in FIG. 8E, the resist pattern 30 is removed. Processes thereafter are the same as the processes following the process of forming the intermediate insulation film 33 shown in FIG. 4F in the first embodiment A method of manufacturing a flash memory according to a fourth embodiment will be disclosed with reference to FIGS. 9A to 9D.

Figure 9A:
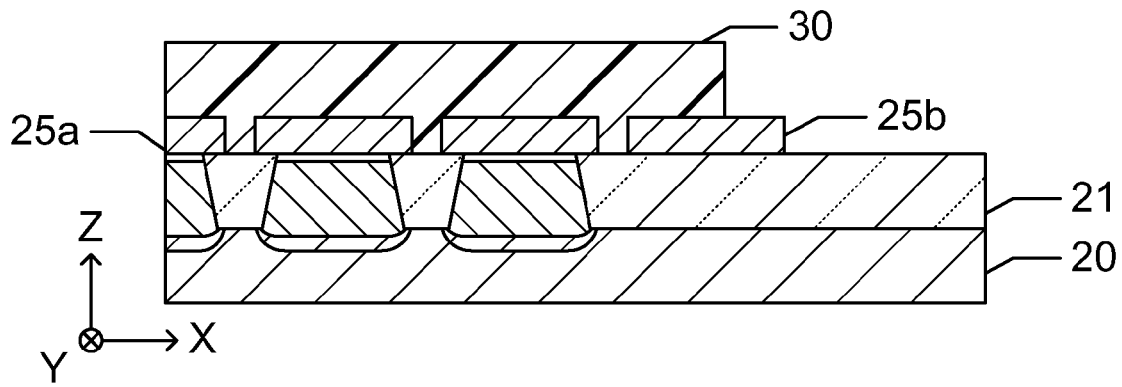
FIGS. 9A to 9D are sectional views illustrating a method of manufacturing a flash memory according to a fourth embodiment.
Figure 9B:
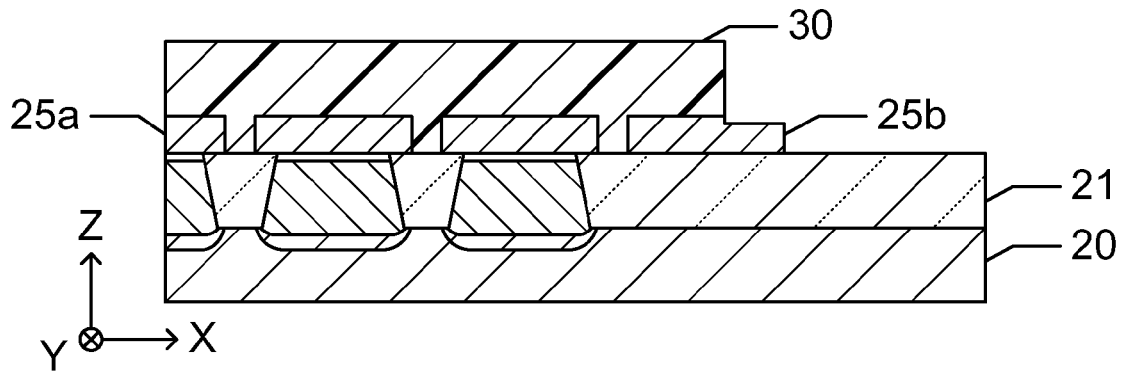
Figure 9C:
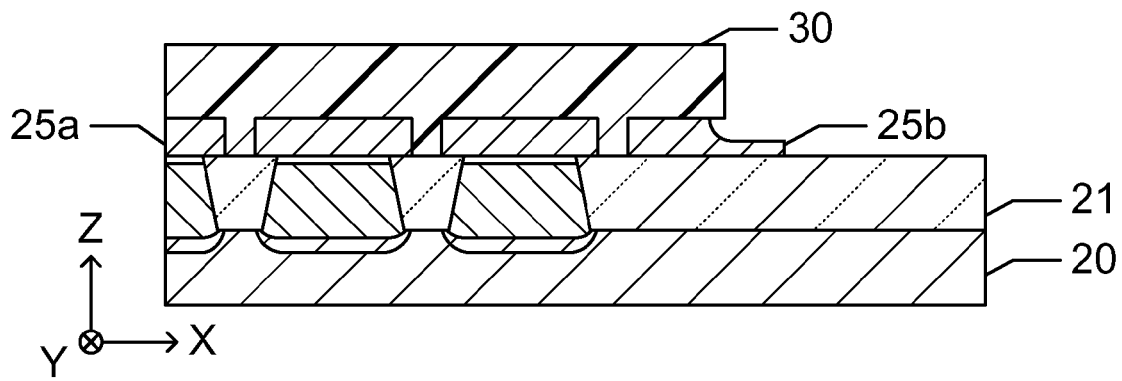
Figure 9D:
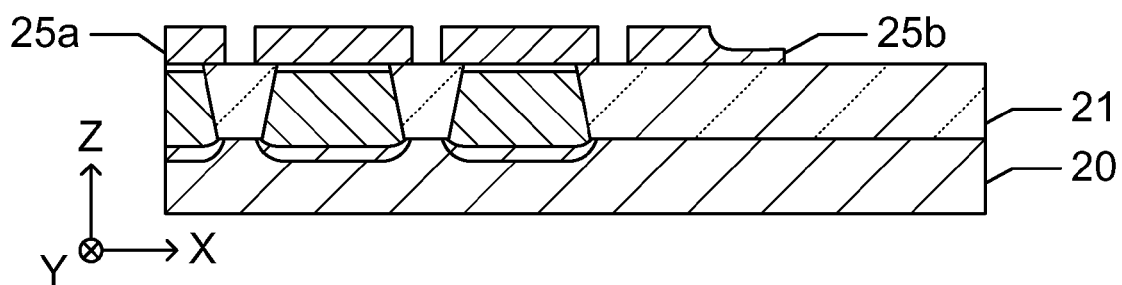

A structure shown in FIG. 9A is the same as the structure shown in FIG. 4D in the first embodiment. As shown in FIG. 9B, a part of the step reduction pattern 25b is anisotropically etched to a certain extent in a thickness direction with use of a resist pattern 30 as a mask. As shown in FIG. 9C, the step reduction pattern 25b is isotropically etched to a certain extent in the thickness direction. After the etching, the resist pattern 30 is removed. Processes thereafter are the same as the processes following the process of forming the intermediate insulation film 33 shown in FIG. 4F in the first embodiment.

A top surface of the step reduction pattern 25b may be formed as a gentle slope by performing the anisotropic etching and then performing the isotropic etching.

A method of manufacturing a flash memory according to a fifth embodiment will be disclosed with reference to FIGS. 10A to 10D.

Figure 10A:
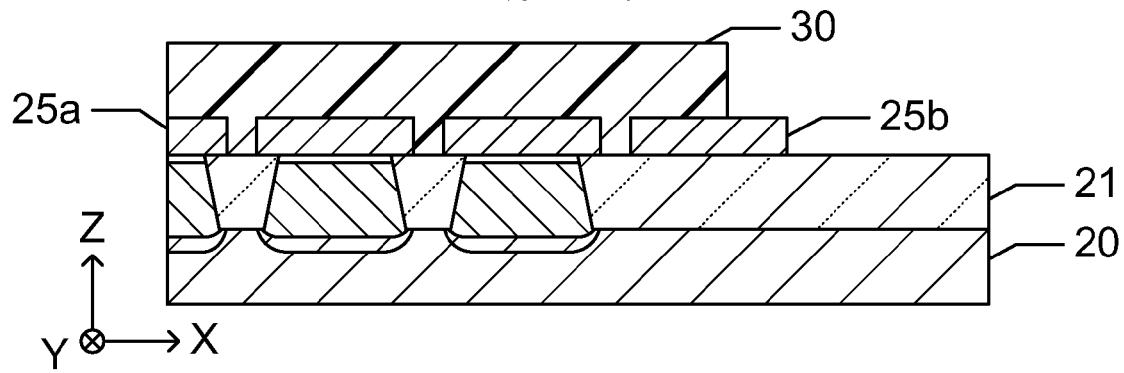
FIGS. 10A to 10D are sectional views illustrating a method of manufacturing a flash memory according to a fifth embodiment.
Figure 10B:
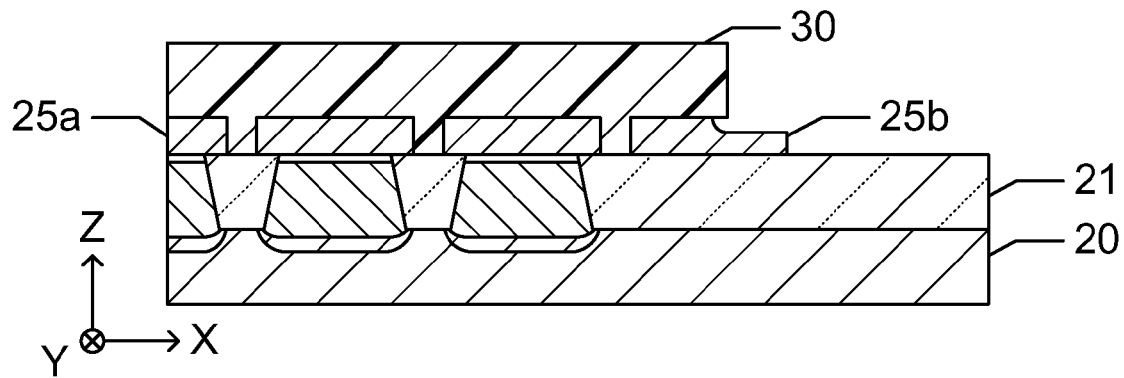
Figure 10C:
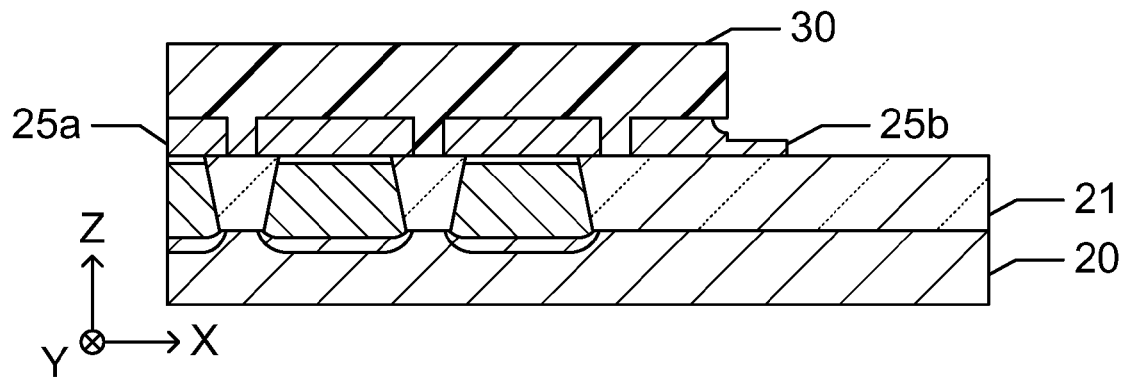
Figure 10D:
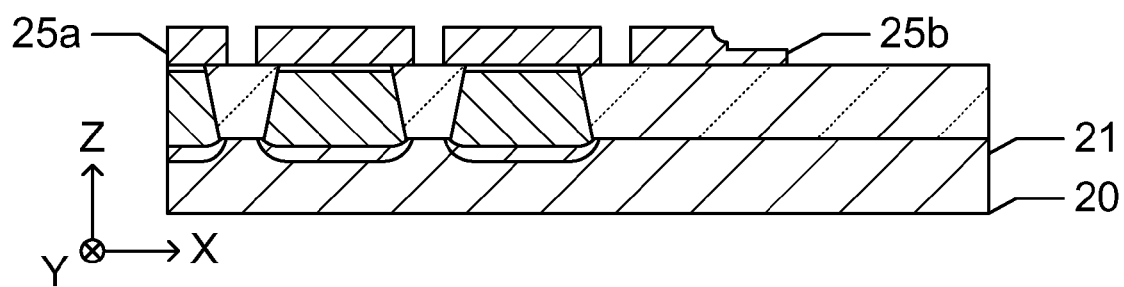

A structure shown in FIG. 10A is the same as the structure shown in FIG. 4D according to the first embodiment. As shown in FIG. 10B, a part of the step reduction pattern 25b is isotropically etched to a certain extent in a thickness direction with use of a resist pattern 30 as a mask. As shown in FIG. 10C, the part of the step reduction pattern 25b is anisotropically etched to a certain extent in the thickness direction. As shown in FIG. 10D, the resist pattern 30 is removed.

A step formed over a top surface of the step reduction pattern 25b may be formed gently by performing the isotropic etching and then performing the anisotropic etching.

Figure 11A:
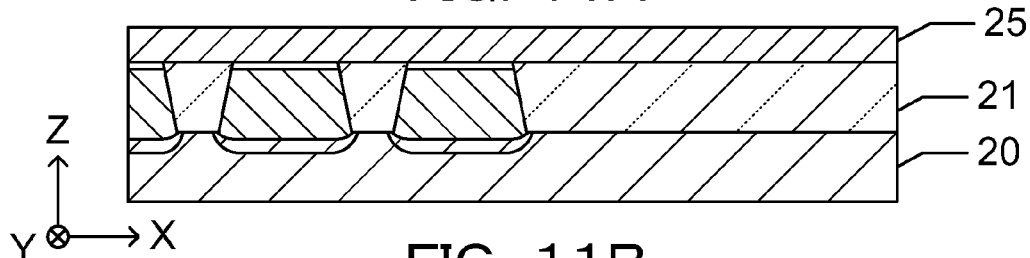
FIGS. 11A to 11E are sectional views illustrating a method of manufacturing a flash memory according to a sixth embodiment.

A method of manufacturing a flash memory according to the sixth embodiment will be disclosed with reference to FIGS. 11A to 11E. A structure shown in FIG. 11A is the same as the structure shown in FIG. 4B according to the first embodiment.

Figure 11B:
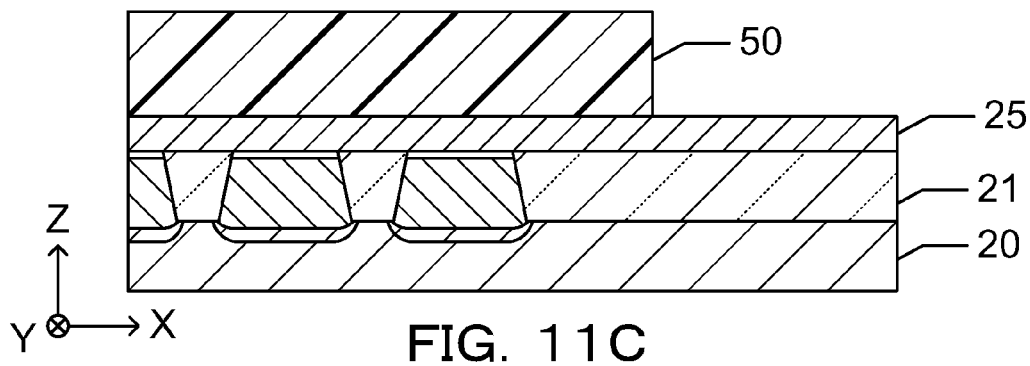

As shown in FIG. 11B, a resist pattern 50 covering a part of a first conductive film 25 is formed.

Figure 11C:
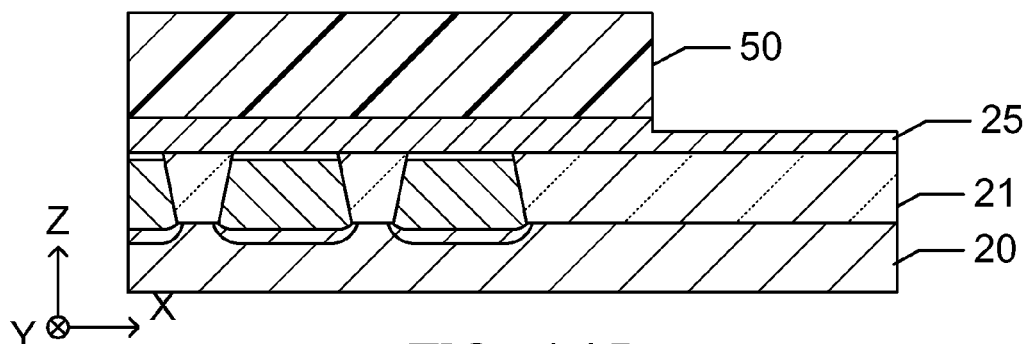
Figure 11D:
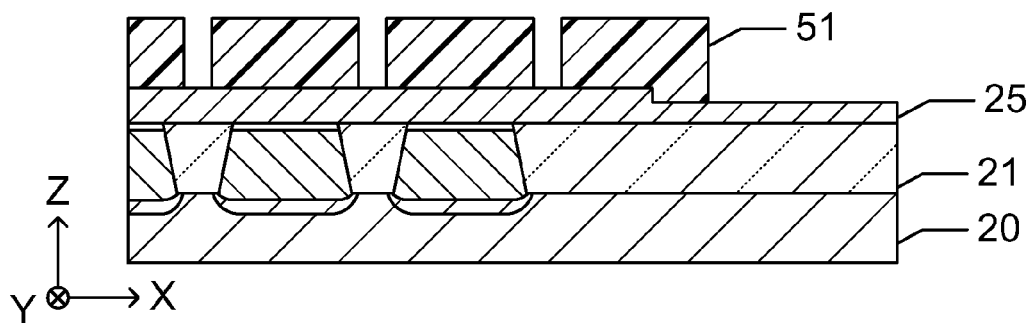

As shown in FIG. 11C, a part of the first conductive film 25 is etched to a certain extent in a thickness direction with use of the resist pattern 50 as a mask, so that a step is formed over the first conductive film 25. Thereafter, the resist pattern 50 is removed.

As shown in FIG. 1D, a resist pattern 51 is newly formed over the first conductive film 25. The resist pattern 51 corresponds to planer shapes of the first conductive pattern 25a and of a step reduction pattern 25b shown in FIG. 5A in the first embodiment. The outermost resist pattern 51 is formed such that the outermost resist pattern 51 covers the step. The first conductive film 25 is etched with use of the resist pattern 51 as a mask. Thereafter, the resist pattern 51 is removed.

Figure 11E:
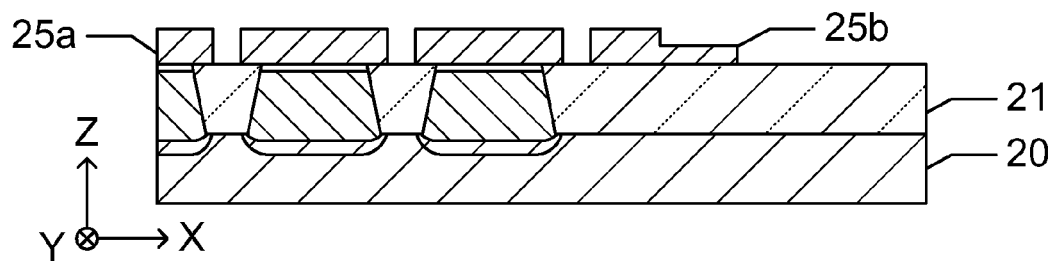

As shown in FIG. 11E, the first conductive pattern 25a and the step reduction pattern 25b are formed. In the first embodiment, the step reduction pattern 25b is formed and thereafter the step is formed over the top surface thereof. On the other hand, in the sixth embodiment, the step is formed in advance over an area where the step reduction pattern 25b is to be formed, prior to the patterning of the first conductive film 25. The method of forming the step over the top surface of the first conductive film 25 is not limited to the method disclosed according to the first embodiment and the methods disclosed in the second to fifth embodiments are also applicable.

Example embodiments of the present invention have now been described in accordance with the above advantages. It will be appreciated that these examples are merely illustrative of the invention. Many variations and modifications will be apparent to those skilled in the art.

What is claimed is:

1. A semiconductor device comprising:
   a semiconductor substrate;
   a plurality of first conductive patterns provided in a first direction over the semiconductor substrate;
   a second conductive pattern provided in parallel to the plurality of first conductive patterns over the semiconductor substrate, the second conductive pattern provided on an outside of an outermost first conductive pattern of said first conductive patterns;
   a first insulation film formed over the plurality of first conductive patterns and the second conductive pattern; and
   a third conductive pattern formed over the first insulation film;
   wherein the second conductive pattern includes a first sidewall and a second sidewall opposite to the first sidewall, one of the first conductive patterns adjacent to the second conductive pattern includes a third sidewall facing the first sidewall;
   wherein a first thickness of the first sidewall is thicker than a second thickness of the second sidewall, a third thickness of the third sidewall is thicker than the second thickness, and the first thickness substantially equal to the third thickness;
   wherein the plurality of first conductive patterns are electrically isolated from each others, and the second conductive pattern is electrically isolated from the plurality of first conductive patterns.

2. The semiconductor device according to claim 1, further comprising:
   an element isolation insulation film formed over the semiconductor substrate, wherein the second conductive pattern is formed over the element isolation insulation film.

3. The semiconductor device according to claim 1, wherein the third conductive pattern includes silicon.

4. The semiconductor device according to claim 3, further comprising:
   a metal silicide layer formed over the third conductive pattern.

5. The semiconductor device according to claim 4, further comprising:
   a sidewall spacer formed over a sidewall of the third conductive pattern.

6. The semiconductor device according to claim 1, wherein the third conductive pattern fills spaces between the first conductive patterns.

7. The semiconductor device according to claim 1, wherein the third conductive pattern is a linear pattern extending in the first direction.

8. A semiconductor device comprising:
   a semiconductor substrate;
   a plurality of first conductive patterns provided in a first direction over the semiconductor substrate;
   a second conductive pattern provided in parallel to the plurality of first conductive patterns over the semiconductor substrate and having a first sidewall located on a near side of the plurality of the first conductive patterns, a first height of the first sidewall being higher than a second height of a second sidewall located on a far side of the first conductive patterns, the second conductive pattern provided on an outside of an outermost first conductive pattern of said first conductive patterns;
   a first insulation film formed over the plurality of first conductive patterns and the second conductive pattern; and
   a third conductive pattern formed over the first insulation film;
   wherein the plurality of first conductive patterns are electrically isolated from each others, and the second conductive pattern is electrically isolated from the plurality of first conductive patterns
   wherein one of the first conductive patterns adjacent to the second conductive pattern includes a third sidewall facing the first sidewall;
   wherein a third height is higher than the second height, and the first height is substantially equal to the third height.

9. The semiconductor device according to claim 8, further comprising:
   an element isolation insulation film formed over the semiconductor substrate, wherein the second conductive pattern is formed over the element isolation insulation film.

10. The semiconductor device according to claim 8, wherein the third conductive pattern includes silicon.

11. The semiconductor device according to claim 10 further comprising:
    a metal silicide layer formed over the third conductive pattern.

12. The semiconductor device according to claim 11, further comprising:
    a sidewall spacer formed over a sidewall of the third conductive pattern.

13. The semiconductor device according to claim 8, wherein the third conductive pattern fills spaces between the first conductive patterns.

14. The semiconductor device according to claim 8, wherein the third conductive pattern is a linear pattern extending in the first direction.

15. The semiconductor device according to claim 1, wherein;
    the second conductive pattern has a part of a top surface which is stepwisely or gradually decreased in height in a direction from the first sidewall toward the second sidewall.

* * * * *